United States Patent
Parkin

(10) Patent No.: US 9,459,304 B1
(45) Date of Patent: *Oct. 4, 2016

(54) METHOD OF FAULT PREDICTION FOR ELECTRICAL DISTRIBUTION SYSTEMS AND MONITORED LOADS

(71) Applicant: Perry Parkin, Camas, WA (US)

(72) Inventor: Perry Parkin, Camas, WA (US)

( * ) Notice: Subject to any disclaimer, the term of this patent is extended or adjusted under 35 U.S.C. 154(b) by 434 days.

This patent is subject to a terminal disclaimer.

(21) Appl. No.: 13/961,255

(22) Filed: Aug. 7, 2013

Related U.S. Application Data

(60) Provisional application No. 61/680,807, filed on Aug. 8, 2012.

(51) Int. Cl.
*G01R 31/02* (2006.01)

(52) U.S. Cl.
CPC .................... *G01R 31/025* (2013.01)

(58) Field of Classification Search
CPC .... G01R 31/00; G01R 31/02; G01R 31/024; G01R 31/08; G01R 31/086; G01R 31/1236; G01R 19/2513

See application file for complete search history.

(56) References Cited

U.S. PATENT DOCUMENTS

| | | | | |
|---|---|---|---|---|
| 6,404,348 B1 * | 6/2002 | Wilfong | ............. | G01R 19/2513 340/538.17 |
| 6,917,888 B2 * | 7/2005 | Logvinov | ................ | H04B 3/54 324/512 |

\* cited by examiner

*Primary Examiner* — Toan Le
(74) *Attorney, Agent, or Firm* — Rylander & Associates; Philip R. M. Hunt

(57) ABSTRACT

A method for fault prediction in electrical systems. It includes a network of recording nodes that transmit data to multi-channel recorder. The nodes monitor power quality based on a number of system parameters. These data are assembled into data blocks and are analyzed to determine load factors for the system over time. Data blocks are collected over 22 cycle periods and are evaluated against a derived standard deviation factor for the given system. The standard deviation is used to determine alert and alarm levels. The constant monitoring allows the system to alert workers of a potential upcoming fault in one or more system components. In this way repairs can be made before the component fails and the system experiences a fault condition.

35 Claims, 28 Drawing Sheets

| |
|---|
| PQ-Node ID |
| Voltage Time Stamp |
| Max. Peak Voltage |
| Min. Peak Voltage |
| Delta V-Rms |
| Mean Avg V-Rms |
| Max V-Rms |
| Min V-Rms |
| V-Rms Std. Dev. |
| Hz |
| Current Time Stamp |
| Max Peak Current |
| Delta I-Rms |
| Mean Avg I-Rms |
| I-Rms Std. Dev. |
| Delta V/ Delta I |
| Watts |
| Joules (Watt*sec) |
| Power Factor |
| Accumulated Time |
| Data block Number |

51 → Voltage Time Stamp, Max. Peak Voltage, Min. Peak Voltage, Delta V-Rms

52 → Delta I-Rms, Mean Avg I-Rms, I-Rms Std. Dev.

50 → (table)

55 → Power Factor

Figure 7

New Data Block

| PQ-Node ID |
|---|
| Voltage Time Stamp |
| Max. Peak Voltage |
| Min. Peak Voltage |
| Delta V-Rms |
| Mean Avg V-Rms |
| Max V-Rms |
| Min V-Rms |
| V-Rms Std. Dev. |
| Hz |
| Current Time Stamp |
| Max Peak Current |
| Delta I-Rms |
| Mean Avg I-Rms |
| I-Rms Std. Dev. |
| Delta V/ Delta I |
| Watts |
| Joules (Watt*sec) |
| Power Factor |
| Accumulated Time |
| Data block Number |

Voltage Volatility Envelope
Range of accepted Voltage values based upon a 1.4% deviation established by the V-RMS Std. Dev.

| 3.35 Volts | 3.55 Volts |
|---|---|
| 119.6 Volts | 123.0 Volts |

| 1.38% | 1.42% |
|---|---|

Current Volatility Envelope
Range of accepted Current values based upon a 1.5% deviation established by the I-RMS Std. Dev.

| 0.44 Amps | 0.46 Amps |
|---|---|
| 12.21 Amps | 12.59 Amps |
| 1.48% | 1.52% |

| 80.77% | 83.23% |
|---|---|

Figure 16a

Compression Data Block

| Field | Value |
|---|---|
| PQ-Node ID | |
| Voltage Time Stamp | |
| Max. Peak Voltage | |
| Min. Peak Voltage | |
| Delta V-Rms | 3.5 Volts |
| Mean Avg V-Rms | 121.3 Volts |
| Max V-Rms | |
| Min V-Rms | |
| V-Rms Std. Dev. | 1.4% |
| Hz | |
| Current Time Stamp | |
| Max Peak Current | |
| Delta I-Rms | 0.45 Amps |
| Mean Avg I-Rms | 12.4 Amps |
| I-Rms Std. Dev. | 1.5% |
| Delta V/ Delta I | |
| Watts | |
| Joules (Watt*sec) | |
| Power Factor | 82% |
| Accumulated Time | |
| Data block Number | |

Figure 16b

METHOD OF FAULT PREDICTION FOR ELECTRICAL DISTRIBUTION SYSTEMS AND MONITORED LOADS

CROSS REFERENCE TO RELATED APPLICATIONS

This application claims benefit of Provisional application 61/680,807 filed Aug. 8, 2012.

STATEMENT REGARDING FEDERALLY SPONSORED RESEARCH AND DEVELOPMENT

Not Applicable

BACKGROUND OF THE INVENTION

1. Field of the Invention

This invention relates to methods of fault prediction and particularly fault prediction methods for electrical distribution systems and monitored loads.

2. Description of the Prior Art

Electrical power has become the most essential commodity of our everyday needs. In manufacturing, where systems like "lean manufacturing" and "just in time" delivery philosophies are pervasive, a reliable and dependable electrical distribution system is more critical to a business's fiscal health than ever before. Unfortunately, global competition has forced production quotas in many companies and industries to increase, while at the same time, forcing many companies to make reductions in their labor force and maintenance budgets as they attempt to reduce operating costs. Such cost savings measures can be expensive. Insurance claims data published in the National Fire Prevention Association (NFPA) publication 70B maintenance standard, shows that almost half of the cost associated with electrical failures could have been prevented. The typical service life of electrical equipment is generally 25-30 years depending on maintenance and upkeep, and much of the aging infrastructure has been in service for 20 years or longer. With electrical distribution systems aging year-by-year, and preventative maintenance programs being cut to improve the corporate bottom line, the likelihood of a facility experiencing a catastrophic failure to its electrical distribution system is increasing.

Another concern for those responsible for the maintenance of electrical systems is that of electrical transients. An electrical transient is a temporary excess of voltage and/or current in an electrical circuit that has been disturbed. Transients are short duration events, typically lasting from a few thousandths of a second (milliseconds) to billionths of a second (nanoseconds), and they are found on all types of electrical, data, and communications circuits. The electrical distribution system and attached load equipment is under constant attack from various types of power line disturbances. The result is an estimated $26 billion-per-year cost to U.S. companies in lost time, equipment repair, and equipment replacement. Transient voltage surges comprise the most severe and immediate danger to sensitive electrical and electronic equipment, and are often a neglected aspect of facility design.

Studies have shown that approximately 80% of transient activity at a given facility may be internally generated. From the normal on-and-off switching of copiers, heating and ventilation, capacitor banks, and air conditioning systems to robotic assembly and welding machines, practically every industrial machine or system causes or is adversely affected by transients. Surges and transient power anomalies are potentially destructive electrical disturbances, the most damaging being over-voltage occurrences and short duration over-voltage events, and the cumulative effect of these transients are a major source of semi-conductor degradation and failure. Thus, a system that can predict electrical faults in enough time to correct them before they cause serious problems is needed.

BRIEF DESCRIPTION OF THE INVENTION

This invention overcomes the limitations of the systems discussed above. It does this by doing load analysis, which generally includes monitoring a load's electrical current by measuring and recording its value over time and producing an alarm when some static threshold is exceeded. This requires developing a means to identify the operational characteristics that define the load. The operational characteristics of an electrical load are fundamentally defined by how the load draws current from a voltage source. This means that load analysis is synonymous with current analysis. Current analysis identifies current as more than just a quantity or magnitude of amps flowing through a conductor. Current is also identified by its displacement factor with respect to the voltage, referred to here as power factor, and by the Total Harmonic Distortion, or THD, of its sine wave. These three elements of the load current, its Root Mean Square (RMS) value, power factor and THD are used to create frames of reference for describing the operational characteristics of a load.

A fourth element, the standard deviation of the RMS current, is also used as a frame of reference. Once this framework is developed, the operational boundaries can be identified, and thresholds based upon these boundaries determined. The system is designed to automatically select the threshold values for the analysis that generates the alerts, warnings and alarms for the system.

Once accurate thresholds are developed, the automating reliable system response is a matter of creating predetermined patterns of response to the various thresholds that may be crossed. It can be programmed to include active responses for the mitigation of developing faults and conditions such as automated power factor correction, where capacitor banks are automatically brought on or off line in response to the changing power factor measured at the main service.

Quantifying the volatility of an electrical system allows for predictive analysis. The concept of volatility as a unique measure for the study of electrical variables is fundamental to this invention. Analyzing volatility increases dramatically the ability for predicting electrical faults. For example, a fault condition arises when the normal electrical values associated with the proper operation of an electrical system are exceeded. The first indication of such a change would be a change in the relative volatility of one or more of the electrical values that define the operating parameters for that system. Measuring this volatility and trending the volatility of these values over time reveals the earliest possible warning that a change has occurred in the stability of that system. Typical power quality monitoring uses predetermined static values as thresholds to alert of a possible problem. The trouble with this method is that waiting for a threshold to be crossed by some electrical variable before being alerted that a problem exists is being informed that a problem exists when it already exists. While this may be informative, it's not predictive.

Because the automated predictive analysis method is fundamentally comparative, a baseline of values for comparison purposes must first be established for each load that is monitored before any meaningful analysis can be performed. Once a baseline of values has been created, threshold values are then determined that initiate the notification process.

The load profile for a load is constructed by averaging the electrical values of that load over several load cycles. A load cycle is that period of time starting with when the load is initially turned on and continues until it is turned off or disconnected. A load cycle is defined as a collection of concurrently created data blocks, whose I-RMS values exceed the circuit's ambient noise levels. A load cycle begins with one or more single data blocks whose Delta I-RMS value goes positive and whose value exceeds compression limits. The load cycle's I-RMS value then arrives at some relatively stable point where data block compression can begin. The load cycle continues, as a collection of sequentially created compressed and single data blocks, depending on load stability, until ending with a single data block whose Delta I-RMS is negative, and whose I-RMS value returns to the circuit's ambient noise level. The data block values used in defining the operational characteristics for a load cycle, and consequently, the construction of a load profile is taken from the current half of the data block.

Once a load cycle begins, the multi-channel recorder's database takes the electrical values in the current half of the compressed data blocks, plus the current's THD and begins to calculate the load cycles baseline values. These values are used to define the load's operational characteristics.

The fourth value used in defining the operational characteristics of a load is the I-RMS standard deviation value, measured for each compressed data block contained in the load cycle. As explained earlier, this is a measure of the average variance of the RMS current measured for that data block and quantifies its volatility. This value is averaged over time and used as a gage to denote the relative stability or volatility of the load in how it draws current during a load cycle. A sudden increase in this value indicates an increase in the volatility of the current and indicates a potential disequilibrium occurring within the load.

The power factor value, the current THD value and the I-RMS standard deviation value to their corresponding RMS current value provides a common frame of reference by which the relationship between these four variables can be quantified. Their average values, over the span of the load cycle, are used to determine the standard deviation for each variable, which is used in defining its corresponding operational boundary and thereby determining threshold values.

The standard deviation, which defines the operational boundaries for the variable in question, permits the system being monitored to define itself rather than using some predetermined static value. This is important because each load must be considered as unique if accurate load profiles are to be developed that define the operational boundaries of the load. Using standard deviation also facilitates the ability to automate this function because the operational boundary of a load defines the threshold values that are used to drive the automated predictive analysis method.

The many different possible combinations provided by the four load profile elements creates the potential for characterizing the unique way that a load responds to conditions that ultimately drive it to alarm status. Collecting such historical records of a load could be exceedingly valuable in the further development of the capabilities of automated predictive analysis.

Thus, it is an object of the invention to provide automatic notification of potential fault conditions prior to those faults occurring.

It is another object of the invention to provide continuous monitoring of power systems.

It is yet another object of the invention to fully automate predictive analysis methods and apply them to the preventative and predictive maintenance system.

It is yet another object of the invention to produce automatically generated work orders detailing the preventative actions to be taken to repair a piece of equipment before it fails.

It is yet another object of the invention to produce a monitoring system based upon a network of continuously monitored nodes that are permanently installed and whose collected data is synched in time and gathered automatically.

It is yet another object of the invention to provide integrated transient voltage surge suppression.

It is yet another object of the invention to produce an analysis method that introduces system volatility as a unique measure for the study of electrical variables.

BRIEF DESCRIPTION OF THE DRAWINGS

FIG. 7 is a detail view of a basic data block format common to all PQ-nodes.

FIG. 16a is a graphic and textual explanation of a data block compression cycle.

FIG. 16b is a graphic and textual explanation showing how new values are added to a data block compression cycle.

DETAILED DESCRIPTION OF THE INVENTION

Figure 1:
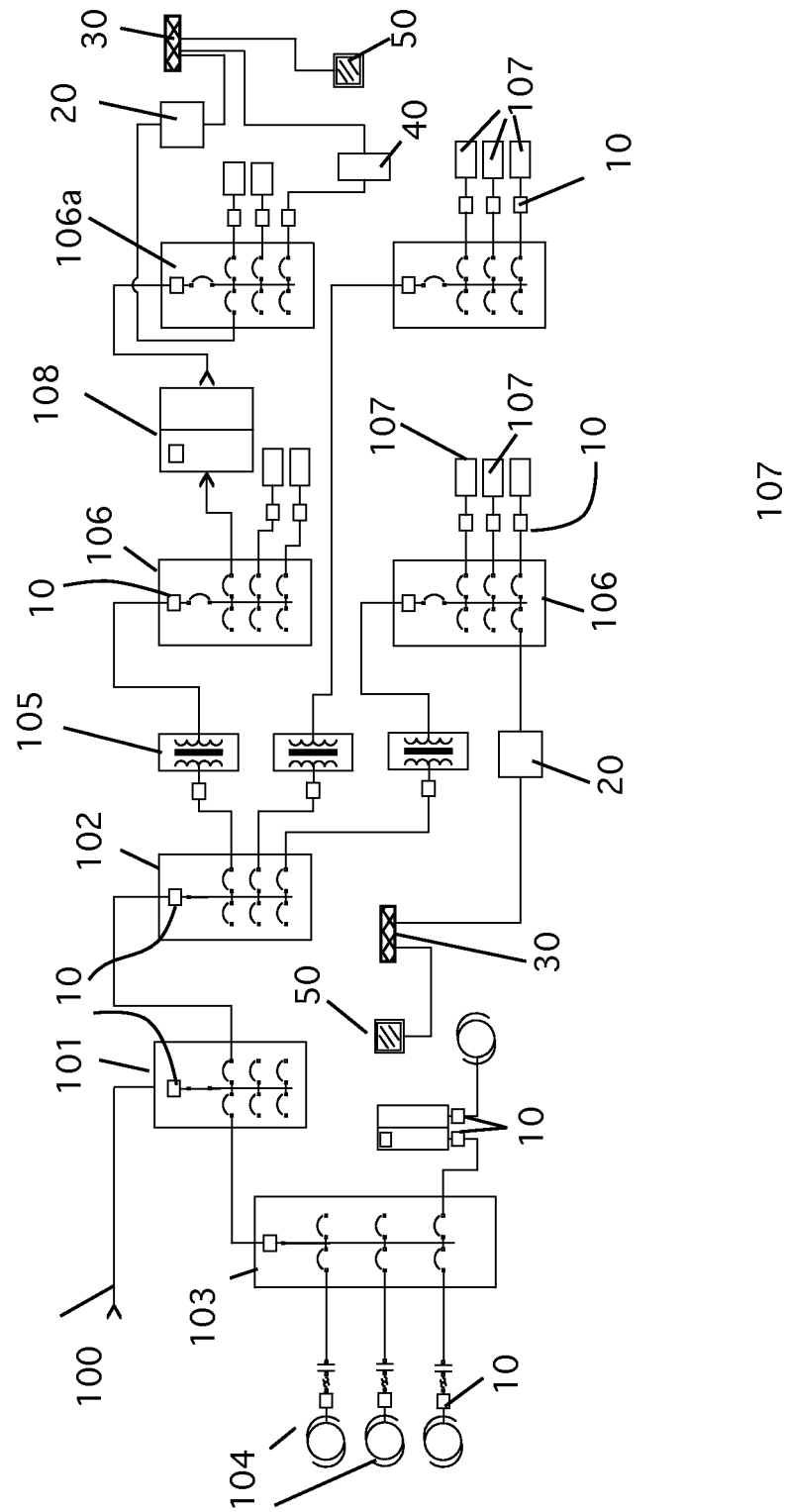
FIG. 1 is a schematic diagram of an electrical system with the present invention components installed.

Typical power quality monitoring uses predetermined static values as thresholds to alert of a possible problem. The trouble with this method is that waiting for a threshold to be crossed by some electrical variable before being alerted that a problem exists, is being informed that a problem exists after it already exists. While this may be informative, it's not predictive.

The term volatility, as it is used here, is defined as the measured deviation of a variable form a determined normative value.

In power quality analysis, voltage and current are the two most important variables. In this system, the voltage is considered the independent variable in contrast to the current, which is considered dependent on the voltage and the impedance of the load.

Voltage is a variable that is regulated, as it is a measure of the electromotive force supplied by a serving utility. The American National Standard for Electric Power Systems and Equipment, ANSI C84.1, is the standard that regulates nominal service voltage ranges supplied to customers. This standard allows for variability of a plus or minus 5% of the nominal system voltage. Using this standard as an example, the volatility of the voltage variable can be expected to be somewhere between 0 and 5%, and will change throughout the day as customers add and subtract loads and the utility responds by performing voltage regulation.

The need for the utility to perform periodic voltage regulation is in response to line losses that are incurred as a result of delivering power to the customer or end user. Hence, voltage fluctuation, or the volatility of the voltage can be a useful measure for determining the stiffness or robustness of an electrical distribution system.

Instead of merely measuring the voltage and comparing it to some threshold, the instant invention analyses the relative volatility of the voltage over time. The relative volatility can be put in terms of a standard deviation. Measuring the standard deviation of the voltage for prescribed time periods, at different places on an electrical distribution system simultaneously, and comparing them provides a means to identify any developing weakness in the electrical distribution system.

In the instant method, the standard deviation of the voltage becomes a measure, which is measured over time. An increase in the volatility of the volatility of a variable over time is an indication of a growing instability from a healthy system. In this way, the measured change in volatility becomes the first indication of a problem, and is an important key to predicting a fault condition. Studying the rate of change to this measure over time, is used to estimate the amount of time that will elapse before user defined thresholds are crossed.

A study of current signatures is also a study of the impedance characterizations of a load. The study includes three basic operating states. The first state is when the load is first energized or turned on, the second is when the load has reached a stable operating point, and the last is when the load is turned off.

Measuring the current elements, (i.e. RMS current, power factor, THD, etc.,) over these three parts of the load's operating cycle and recording them, cycle by cycle, and applying the standard deviation measure to the different elements, defines the inherent volatility of the system under normal operating conditions. Comparing the standard deviation of these values phase to phase and over time provides a complete picture of the overall health of the system. In using this system it is not necessary to know what kind of loads are connected. If the values for the RMS current and the power factor in one of the phases supplying the load begin to drift beyond the historical standard deviation measured for the three phases of RMS current and the three phases of the power factor taken together, then a problem with the load is indicated. The load should be pulled from service and checked.

Used in this way, standard deviation can provide the earliest warning of a possible problem.

Volatility is also be used for data compression. The standard deviation of the RMS voltage and RMS current waveforms, in the preferred embodiment, are derived over a 12-cycle period (based on a 60 cycle per second power system). These two measures define the relative volatility of that group of measured electrical values referred to here as a data block. As discussed below, data blocks are formed continuously, one after another, and can be merged or compressed, as discussed below, based upon the measured standard deviations.

To access these parameters, from the data blocks and analyze them, a system of collection nodes, a receiver and recorder and a computer system are needed. FIGS. 1-12 show details of the systems described below.

This system can best be described as an electrical monitoring and fault prediction system and is composed of three basic parts. The first part of the system is composed of Power Quality Nodes, or PQ-Nodes (see FIGS. 1 and 2. The second part of the system is made up of multi-channel recorders and the third or final part of the system is the System Network Server. A basic system has at least 5 PQ-Nodes, (based upon a three phase electrical distribution system, one PQ-Node for each phase and neutral point monitored at the distribution panel supplying the monitored load and at least one PQ-Node for monitoring at a single phase monitored load) one multi-channel recorder and an Ethernet connection to a server. A functional description of each of these parts of the system is given below.

FIG. 1 is a power system that has the components of the system installed. At the top left of the diagram, the utility service entrance 100 is shown. This line leads to a main service panel 101. In this system, two sub panels are fed from the main distribution panel 101. One is a power distribution panel 102 and the other is a motor control center 103. Three 30 hp motors 104 are connected to the motor control center 103.

Three transformers 105 are attached to the power distribution panel 102 as shown. These transformers serve four branch circuit panels 106. The branch circuit panels 106 serve a number of loads 107. One of the branch circuit panels feeds an Uninterruptible power supply (UPS) 108 that feeds one of the branch circuit panels 106a, which then feeds other loads.

All of these devices are well know in the art. The difference is the use of the invention components, as discussed below.

The first of these is a PQ-Node. A PQ-Node is a multi-channel recorder that measures the single-phase voltage and corresponding single-phase current at the point where it is installed on an electrical distribution system. In FIG. 1, PQ-Nodes 10 are found distributed throughout the system as shown. Other components include a Multi-channel recorder 20, system network hubs 30, a network server 40 and an access terminal 50, also known as a base station. The base station has software, which is a means for analyzing said plurality of data blocks.

All of these components are discussed in detail below.

Figure 2:
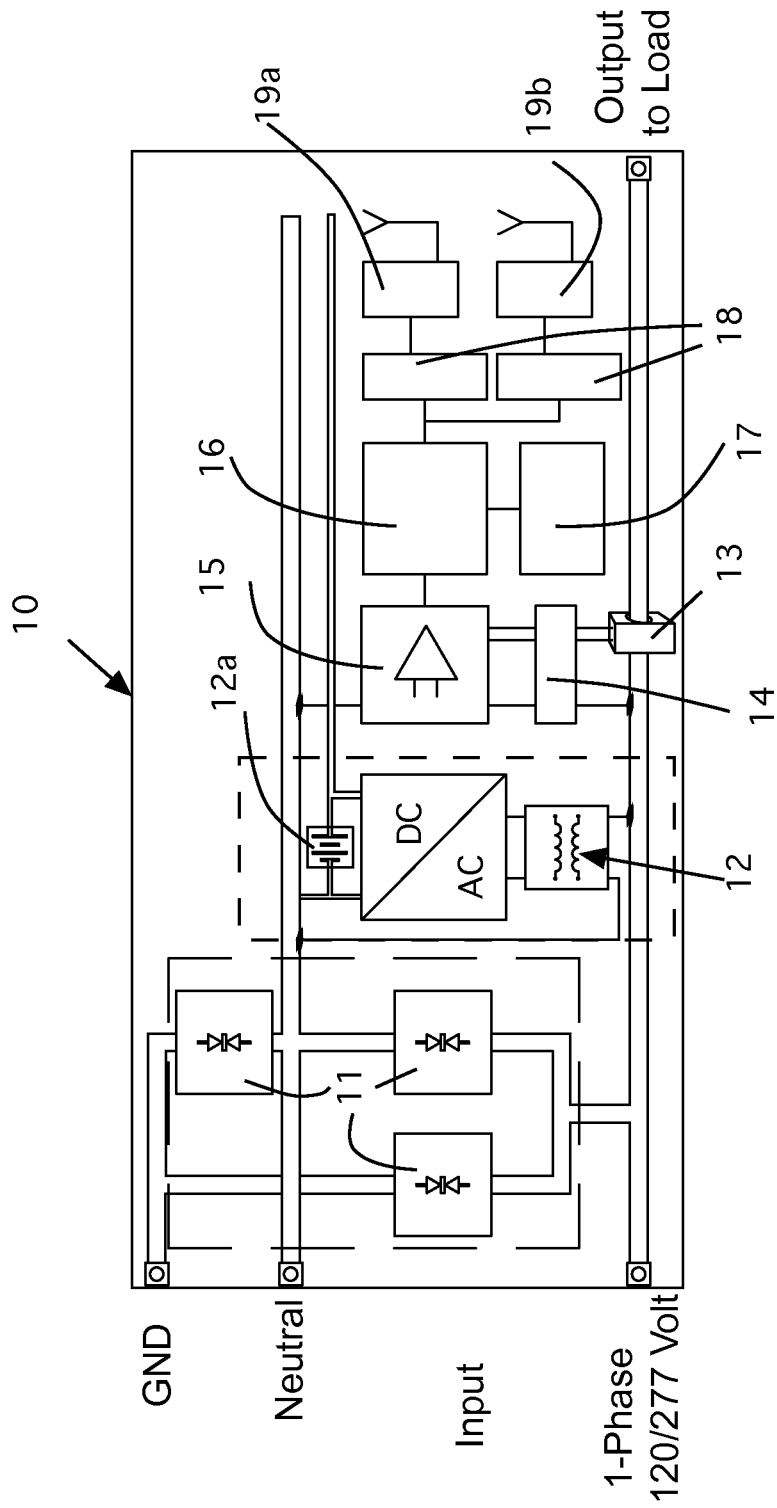
FIG. 2 is a block diagram of a basic PQ-node.
Figure 3:
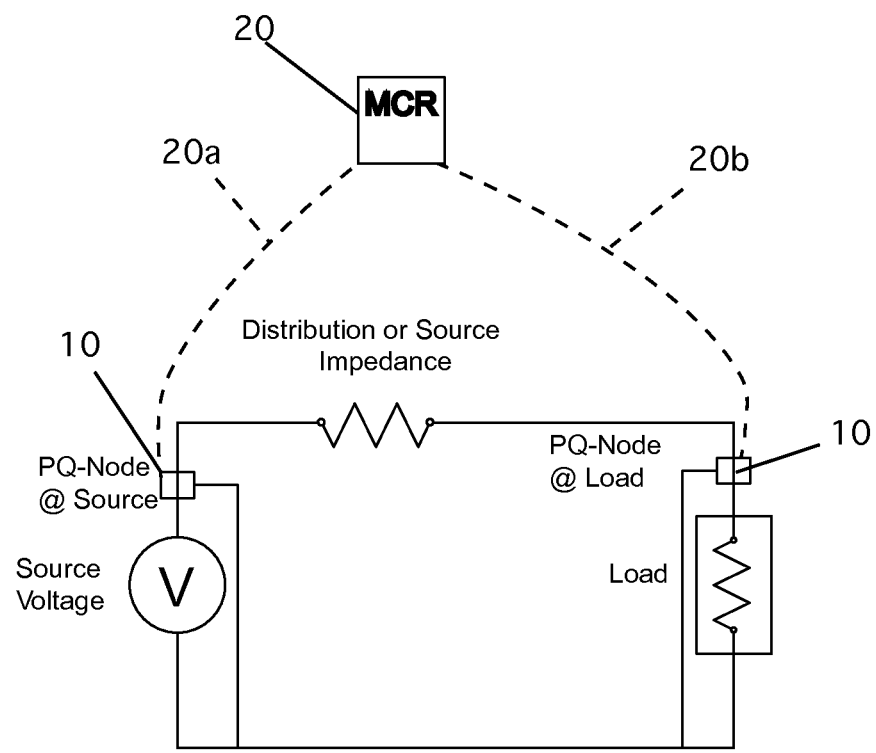
FIG. 3 is a schematic diagram of PQ-Nodes and the wireless communication with a multi-channel recorder.
Figure 4:
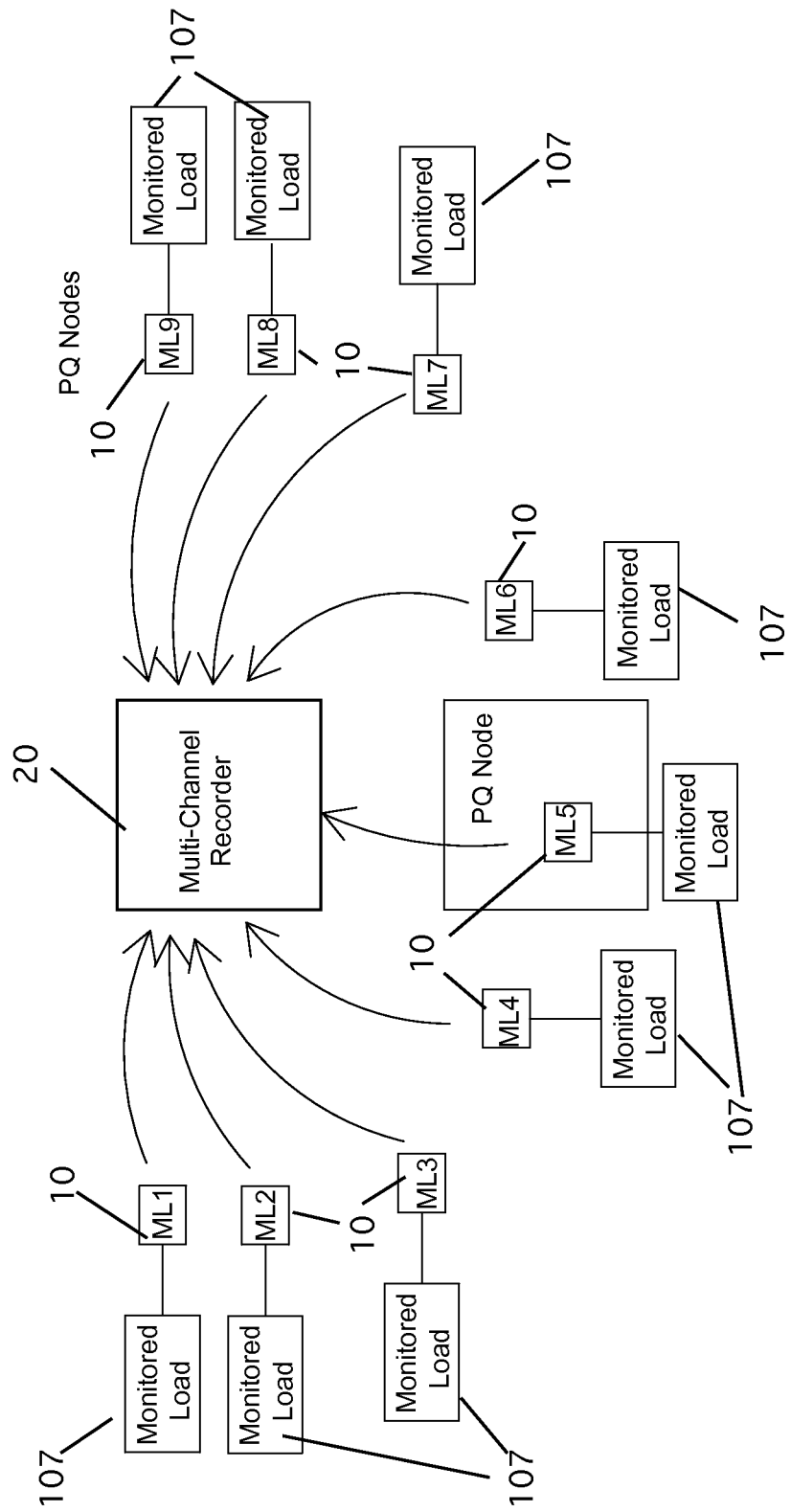
FIG. 4 is a detail showing the PQ-node network transmission to the MCR.
Figure 5:
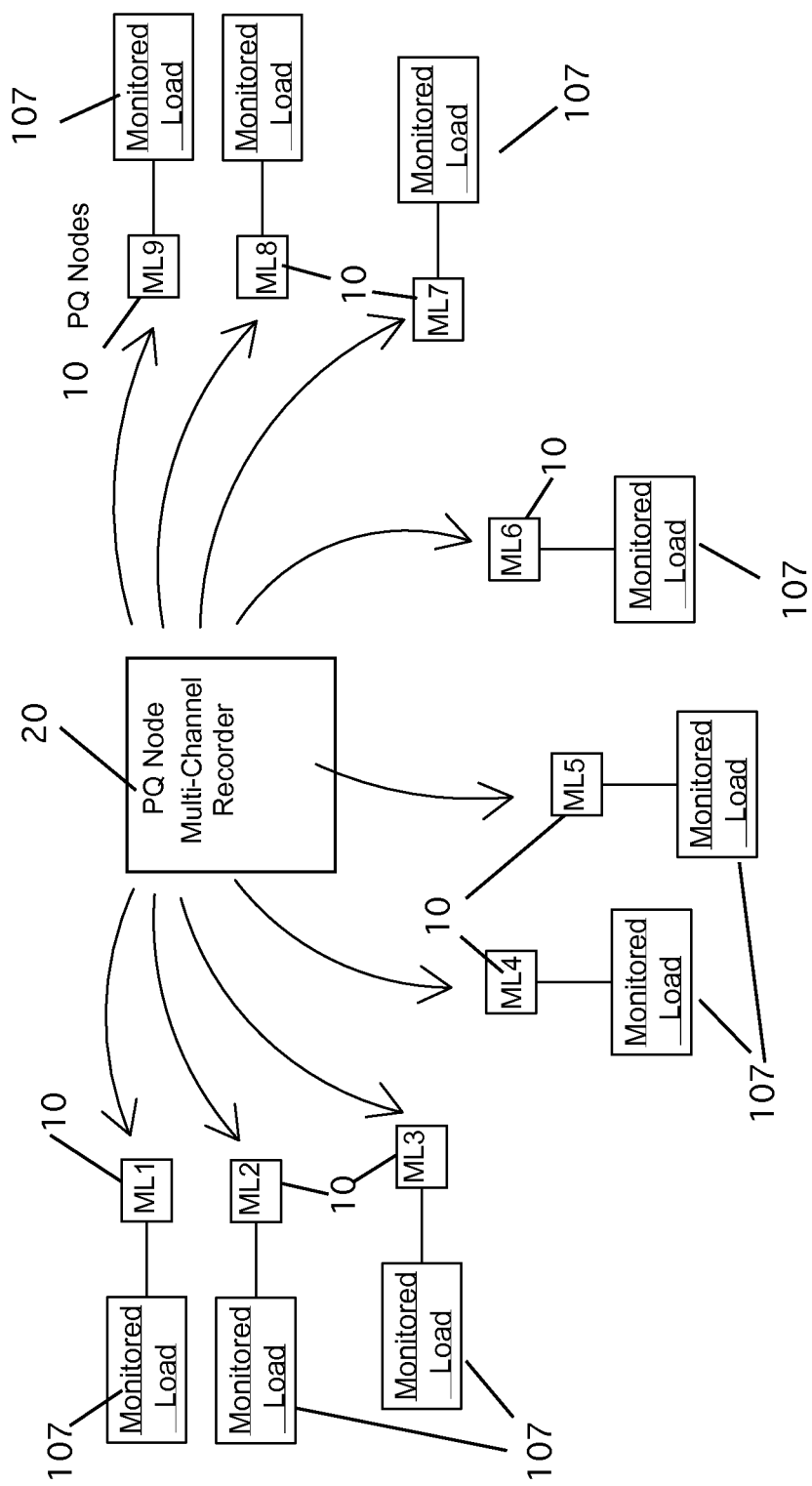
FIG. 5 is a detail showing the PQ-node network transmission from the MCR.
Figure 6:
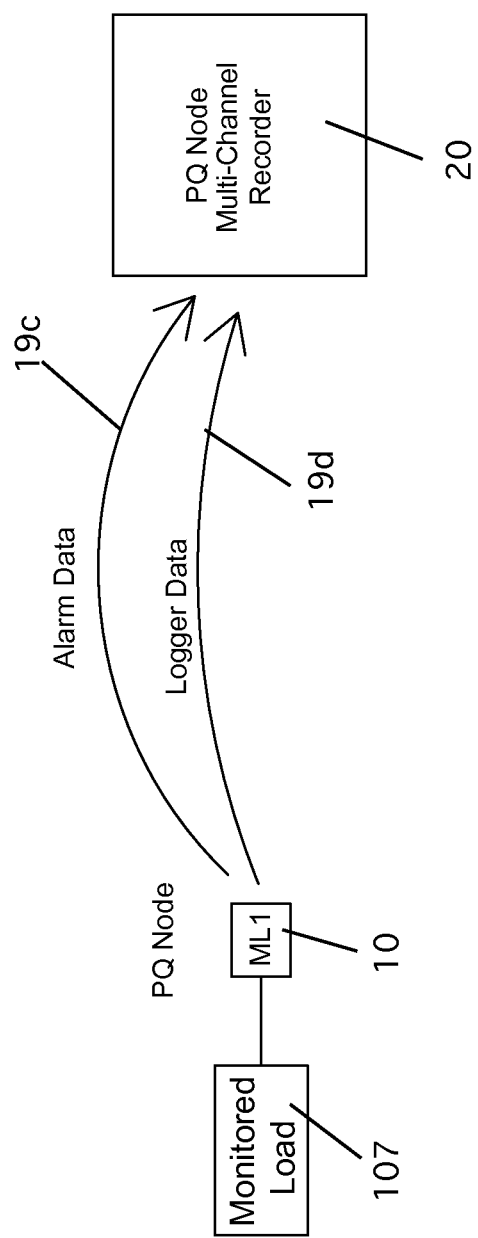
FIG. 6 is a graphic representation of the PQ-Node's data transmission modes to the multi-channel recorder.

The PQ-Nodes contain a number of components. FIG. 2 is a block diagram of a basic PQ-node. Note that each PQ-Node is placed in series with a specific component of the system. Thus, it has an input side where ground, neutral, and line terminals are provided. The PQ-Node circuitry can be protected by transient voltage surge suppression modules 11, as shown. A power supply 12 then provides DC power to the PQ-Node as needed. The voltage channel measures voltage with respect to the grounded conductor or ground. The current is measured via a Hall effect sensor 13, the voltage and current are then filtered and conditioned through a low pass filter 14 and a signal conditioner 15. A microprocessor 16 and ram 17 are provided, as discussed below. Output of the PQ-Node is passed through buffers 18 to an alarm transmitter/receiver 19a and a data logger transmitter/receiver 19b, also as discussed below.

Figure 16:
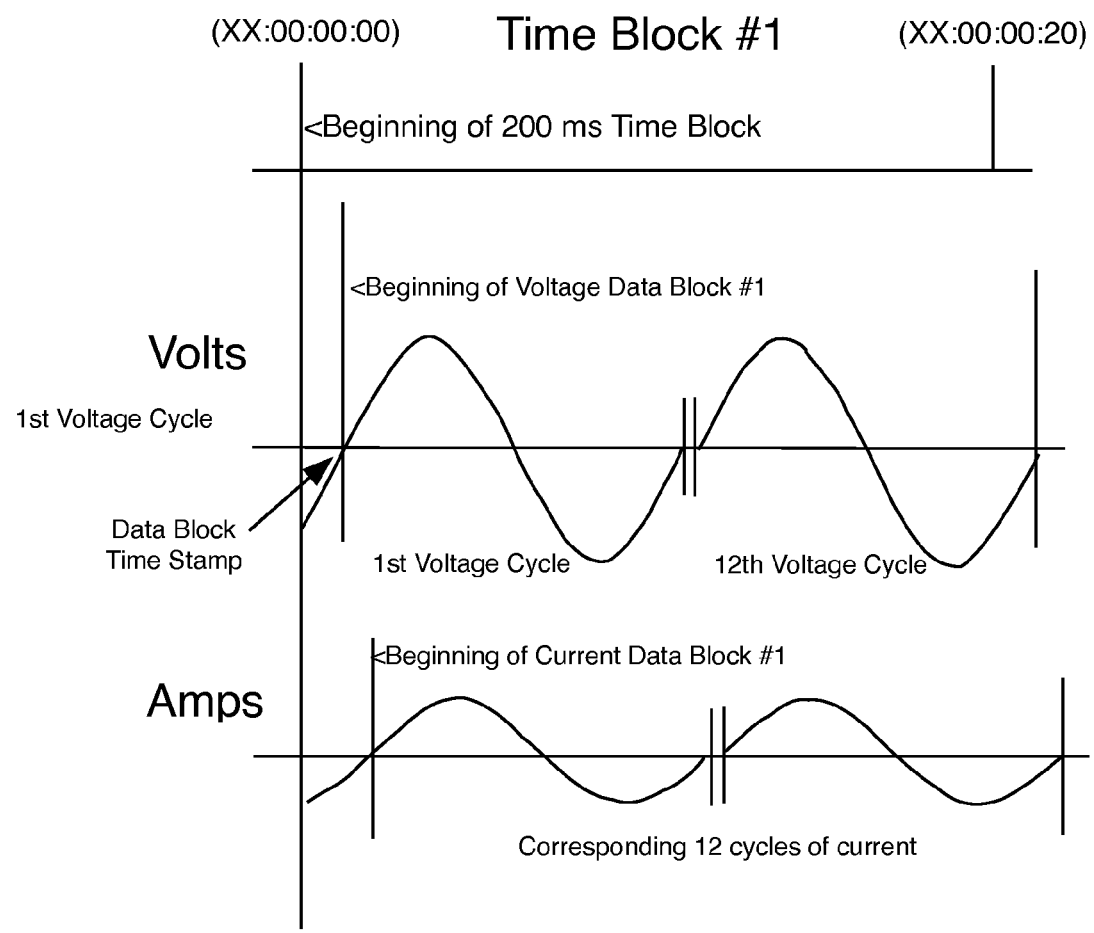
FIG. 16 is a graph of the timing of the formation of time block and the formation of a data block within the time block.

The PQ-Node initially samples the voltage and current simultaneously at 153.6 kHz, or 2560-samples per cycle, per channel with 16-bit resolution. This provides a reasonable level of transient analysis, as well as performing a more accurate determination of the zero crossing point and the peak measurement value of the waveform. Once the waveforms has been sampled and stored in a register 17, they are down sampled by a factor of ten to one, to 256 samples per waveform, starting with the first zero crossing sample identified and continuing from there on through 12 complete cycles, or 24 half cycles. See, FIG. 16. It then converts the sampled data into electrical values, via a microprocessor 16, averages those values over the 12 cycles measured and stores those values into what is referred to here as a data block.

Data blocks are then stored in a comparator register 17 of the PQ-Node and based upon the relative stability or volatility of the measured electrical values are either sent through a compression cycle where concurrent data blocks are merged or the data blocks are sent to the output register where they are prepared for transmission to the multi-channel recorder. This means that the data blocks will be either 12 cycles, (200-milliseconds) in duration or longer due to compression. A 200-millisecond data block indicates that volatile voltage and or current conditions were measured. Compressed data blocks indicate relative periods of electrical stability. The fundamental goal of the PQ-Node is to segregate the volatile periods, where the voltage and/or current values are in relative flux from the stable periods, where the voltage and current values are relatively static over time.

All data blocks, while in the PQ-Node, are stored in nonvolatile memory 17. The PQ-Node derives its power for operations from the circuit, but also has a small battery 12a on board to allow it to operate when power is lost. The battery provides enough power to complete the last data block, the one formed during the 200-milliseconds when power was lost, and move it to a nonvolatile storage register.

A PQ-Node also a means for transmitting the data blocks to the multi-channel recorder either wirelessly or through hard wire connection (e.g., Wi-Fi or RJ-45 connection).

A PQ-Node transmits data to the multi-channel recorder in two possible transmission modes. One mode, the data log mode (using the data logger transmitter/receiver 19b), is dedicated to the transmission of the data blocks from the PQ-Node to the multi-channel recorder, with the transmission of this data initiated by the PQ-Node, based upon the volatility of the data being collected, as explained below. This mode of transmission occurs on a common transmission frequency shared by all the other PQ-Nodes on the network.

The other mode of transmission, called the alarm mode, is initiated by the multi-channel recorder and is sent through the alarm transmitter/receiver 19a. This mode of transmission provides the multi-channel recorder 20 the ability to poll specific data blocks from any PQ-Node on the network at any time, without waiting for the PQ-Node to initiate transmission. What this does is allow the multi-channel recorder 20 to poll individual data blocks from a PQ-Node before the data block enters the data block compression cycle. This feature is crucial to the multi-channel recorders ability to compare data from different PQ-Nodes collected in the same data block period of time. The alarm Mode is also used to transmit the voltage and current waveform signatures that exceed the alarm thresholds set by the user. This feature is crucial in the tracking and determination of the origin of a transient as it enters and moves through the electrical distribution system. Both transmission modes are full duplex modes of transmission.

The next component of the system is the multi-channel recorder 20. This is a basic computer with large permanent storage (e.g. hard drive, flash memory etc.) and a wireless network interface card. It connects directly to the servers 30, via an Ethernet connection. It communicated with the PQ-Nodes via the wireless network card The multi-channel recorder 20 receives the electrical values measured by the PQ-Nodes 10 in the form of data blocks, explained below. The multi-channel recorder houses a data base, and is responsible for grouping and sorting the data blocks from multiple different PQ-Nodes into predefined groups, based upon their relative location on the distribution system. It separates the volatile data blocks-those that are only 200-milliseconds long-from the stable or compressed data blocks of longer time durations. In this way, the database creates and maintains the relative historical volatility indexes used in the monitoring and fault predictive analysis. This fault predictive analysis can be broken down into three basic groups: transient analysis, circuit or distribution analysis and load analysis. An explanation of each is detailed below.

The proposed predictive analysis method employs a combination of historical trend analysis and comparative analysis, comparing data blocks produced by multiple PQ-Nodes in the same block of time. Because the comparative analysis methods performed by the multi-channel recorder's database are time sensitive, time keeping functions between the multi-channel recorder and the PQ-Nodes are of a fundamental concern. The synching of the master clock in the multi-channel recorder with the individual clocks in the PQ-Nodes is maintained by precision timing protocols as explained in IEEE Publication 1588. This synching and calibration is part of every data block transmission that occurs between the PQ-Node and the multi-channel recorder and is crucial to predictive fault analysis.

The multi-channel recorder 20 is also responsible for performing the Fourier analysis on the strings of sampled values that it receives from the PQ-Nodes, called voltage blocks and current blocks, when those nodes go into a compression cycle. (The voltage and current blocks are explained below.) The load analysis is performed via techniques related to current signature analysis and hence the need to analyze the current signature in the frequency domain.

All of this capability is in software stored in the multi-channel recorder, which can be considered means for analyzing said plurality of data blocks.

The next component is the system network server 30, the main interface between the user, the multi-channel recorders 20 and the PQ-Nodes 10, either via a computer terminal, a laptop or other computer peripheral. It provides the means for this system to become enterprise wide, by connecting the multi-channel recorders 20 and nodes 10 in one facility with other systems in other facilities. It provides for direct user access for the setting of various defined user thresholds and for real time data block or transient signature retrieval.

It has the means to correlate data from multiple different multi-channel recorders from different facilities. It has the ability to automatically produce fault prediction warnings and preventative maintenance reports. It also has the ability to periodically and automatically generate energy audit reports. These audits would describe the energy consumption of each load monitored as well as the total load of the building or facility. It should compute the monthly cost for the electrical power consumed by each load including power factor and demand penalties if any, and what percentage of the total cost they represent.

The system server should also provide capacity for long-term storage of data blocks that have historical significance. It should create and maintain a library of recorded fault conditions to be used for comparison and identification of future anomalous electrical conditions.

FIG. 7 is a detail view of a basic data block format common to all PQ-nodes.

The electrical values measured, (i.e. voltage and current) are measured over a 10/12 cycle, (200-millisecond) at 50/60HZ, interval time varies with actual frequency.

As noted above, each PQ-Node initially samples the voltage and current simultaneously at 153.6 kHz, or 2560-samples per cycle, per channel with 16-bit resolution. This provides a reasonable level of transient analysis, as well as performing a more accurate determination of the zero crossing point and the peak measurement value of the waveform. Once the waveforms has been sampled and stored in a register, they are down sampled by a factor of ten to one, to 256 samples per waveform, starting with the first zero crossing sample identified and continuing from there on through 12 complete cycles, or 24 half cycles (see FIG. 16). It then converts the sampled data into electrical values, via the microprocessor 16, averages those values over the 12 cycles measured and stores those values into what is referred to here as a data block. A data block 50 is a collection of measured values sampled and recorded over a specified period of time. This group of recorded values includes but not be limited to, typical electrical measurements such as voltage 51 and current values 52, temperature 54, power factor 55 and any other potentially useful measure that is used in the analysis of a dynamic system.

The measured values are aggregated using the square root of the arithmetic mean of the squared input as specified by the IEC 61000-4-30 standard. The following is a basic description of each electrical value measured and recorded in the data block:

PQ-Node ID: This identifies the PQ-Node that created the data block;

Voltage Time Stamp: this is the actual time of the first zero crossing of the 10/12 concurrent cycles of voltage signatures that are individually sampled and measured;

Max. Peak voltage: this is the maximum peak voltage measured during the time period covered by the data block;

Min. Peak voltage: this is the minimum peak voltage measured during the time period covered by the data block;

Delta V-RMS: this value is the difference in voltage between the last cycle recorded in the data block and the first cycle recorded in the data block. It will have either a Negative, (−), or Positive, (+), value;

Mean Avg. V-RMS: this is the average RMS-voltage recorder over the time period covered by the data block;

Max V-RMS: this is the maximum RMS voltage value recorded during the span of time represented by the data block;

Min V-RMS: this is the minimum RMS voltage value recorded during the span of time represented by the data block;

V-RMS Std. Dev. this value is the standard deviation, expressed as a percentage, of the RMS voltage over the time period covered by the data block;

Hz: this is the average period of the voltage waveform over the time period covered by the data block;

Current Time Stamp: this is the actual time of the first zero crossing of the 10/12 concurrent cycles of current signatures that are individually sampled and measured;

Max. Peak current: this is the maximum peak current measured during the time period covered by the data block;

Delta I-RMS: this value is the difference in current between the last cycle recorded in the data block and the first cycle recorded in the data block. It will have either a Negative, (−), or Positive, (+), value;

Mean Avg. I-RMS: this is the average RMS-current recorded over the time period covered by the data block;

I-RMS Std. Dev: this value is the standard deviation, expressed as a percentage, of the RMS current over the time period covered by the data block;

Source Impedance: the source impedance is derived by dividing the Delta-V by the Delta-I. This value is measured in ohms and is a measure of how much power is lost to the electrical distribution system while it is conveying power to the load;

Watts: this value is the product of the average RMS voltage, the average RMS current and the Power Factor;

Joules (Watt seconds): this is a measure of the electrical energy expended over the time period covered by the data block;

Power Factor: this is a measure of the Cosine angle between the fundamental voltage waveform and the fundamental current waveform;

Accumulated Time: this is the length of time that the data block represents. It has a 200-millisecond minimum value; and data block #: this identifies the data block as to what segment of the hour it was created. (1-18000).

All of these values are analyzed as part of a load cycle analysis. A load profile for a load is constructed by averaging the electrical values of that load over several load cycles. A load cycle is that period of time starting with when the load is initially turned on and continues until it is turned off or disconnected. A load cycle is defined by the automated predictive analysis method as a collection of concurrently created data blocks, whose I-RMS values exceed the circuit's ambient noise levels. A load cycle begins with one or more single data blocks whose Delta I-RMS value goes positive and whose value exceeds compression limits. The load cycle's I-RMS value then arrives at some relatively stable point where data block compression can begin. The load cycle continues, as a collection of sequentially created compressed and single data blocks, depending on load stability, until ending with a single data block whose Delta I-RMS is negative, and whose I-RMS value returns to the circuit's ambient noise level. See FIG. 8, which illustrates a portion of a load cycle showing the variations in RMS current over time and FIG. 9, which is a detail view of a portion of FIG. 8. Each of the segments shown is a data block. As shown, time is the X-axis. These figures will be discussed in detail below.

Another crucial aspect of the load profile analysis is that, as noted above, the system is based upon a network of continuously monitored nodes that are permanently installed and whose collected data is synched in time and gathered automatically. This means that every PQ-Node has its own clock that must be synched to the multi-channel recorder that it is addressed too. Each multi-channel recorder has its internal clock synched to the network server. This network of distributed clocks is kept synchronized via precision timing protocols such as those outlined in IEEE Standard-1588, *Standard for A Precision Clock Synchronization Protocol for Networked Measurement and Control Systems.*

Figure 17:
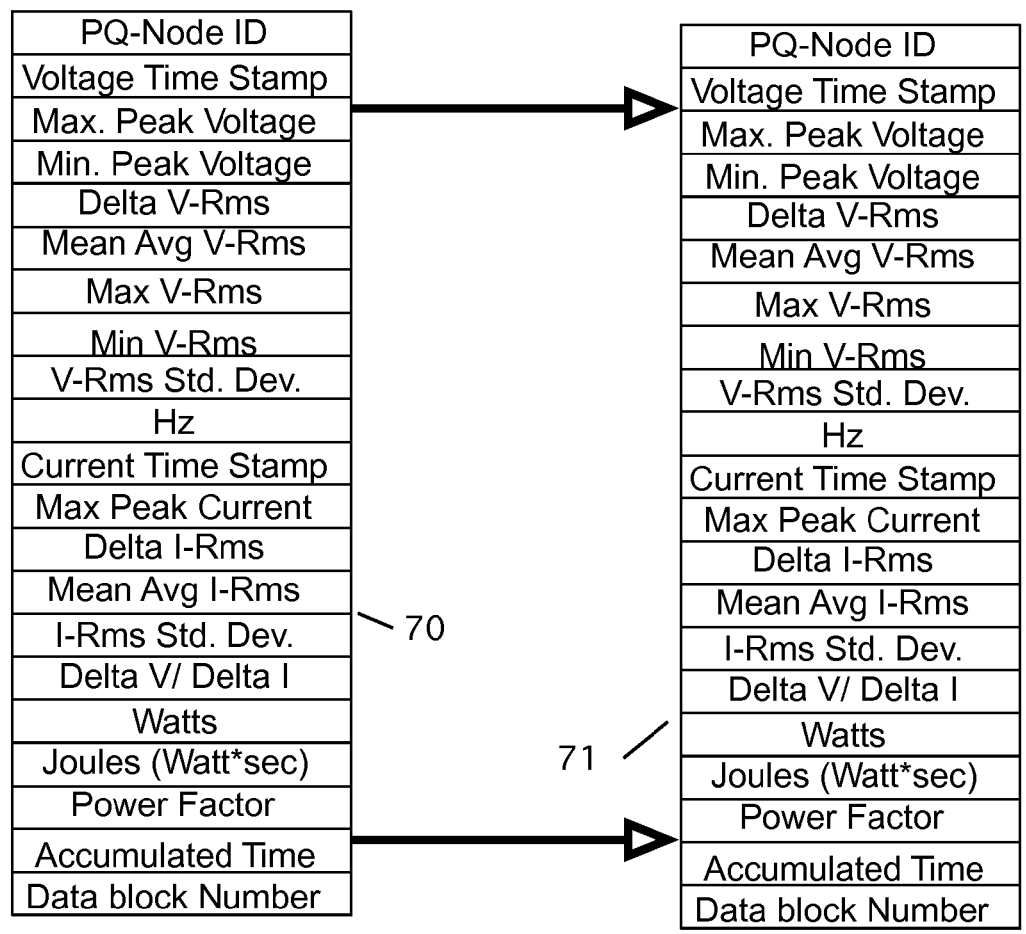
FIG. 17 is a graphic and detail of PQ-node data blocks being linked to a common timing structure.

The fundamental unit of time for this system is the 200-millisecond time block. In this system, each hour of the day is broken up into 18,000, sequentially occurring, 200-millisecond blocks of time. The first block of time is created at the top of the hour, and is referred to here as time block #1. It is initiated at 00':00":00''' and completed at 00':00": 20'''. The second time block is initiated at 00':00":20''' and completed at 00':00":40''' and so on through the 18000$^{th}$ time block, which is initiated at 59':59":80''' and completed at 00':00":00'''. This sequential cycle for the creation of 18,000, 200-millisecond blocks of time per hour, or time blocks, begins all over again at the top of a new hour (see, e.g., FIG. 17). This timing structure is fundamental to how the network of distributed PQ-Nodes collects data. All PQ-Nodes on the network are synched together and act in concert, sampling and measuring the various electrical values, locked in step with this fundamental cycle of time. The period of 200-milliseconds was selected for the time block duration because it provides a common timing factor for both the 50-Hz electrical systems, (10 cycle duration), used in Europe, and the 60-Hz electrical systems, (12 cycle duration), used in the United States.

Data Block Timing:

As noted above, a data block is a collection of measured electrical values taken over a 10 cycle, (for 50-Hz), or 12-cycle, (for 60-Hz), time period (see also, FIG. 7). This time period correlates to the 200-millisecond time block structure explained above. Data block formation begins with the first zero crossing of the voltage and current sine waves occurring in a time block and lasts for 10/12 concurrent cycles. See FIG. 16 for clarification:

Each 10/12-cycle time period of aggregated measured electrical values constitutes a single data block of information. As each hour of the day is broken up into 18,000 blocks of time, or time blocks, there are as well, 18,000 sequentially created data blocks. One data block created for each time block.

Figure 8:
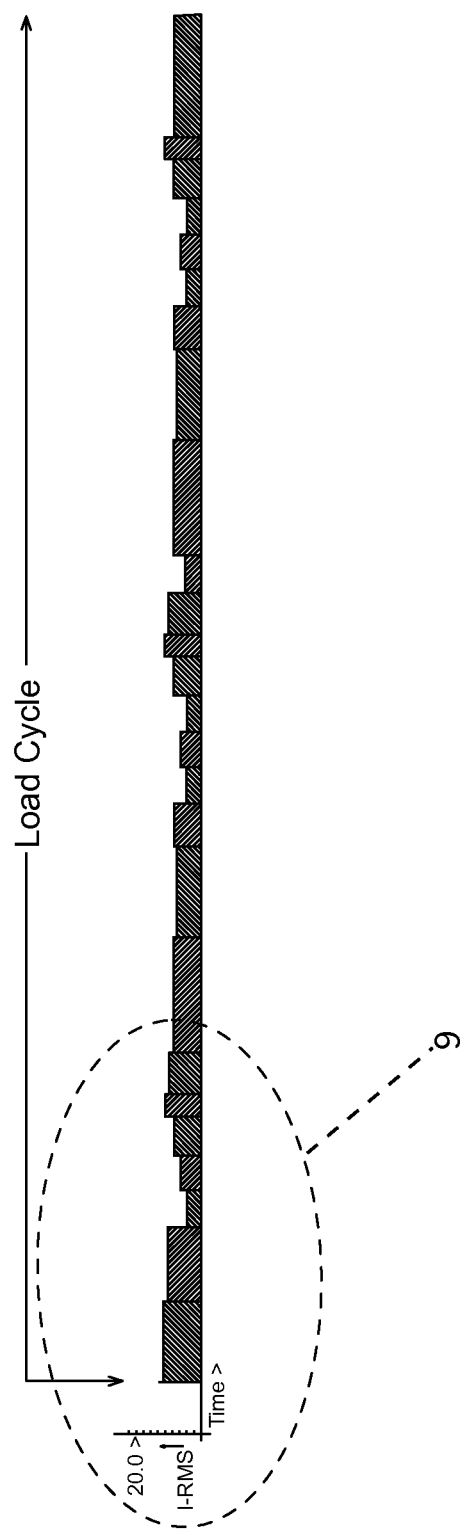
FIG. 8 is a graph of a portion of a load cycle.
Figure 9:
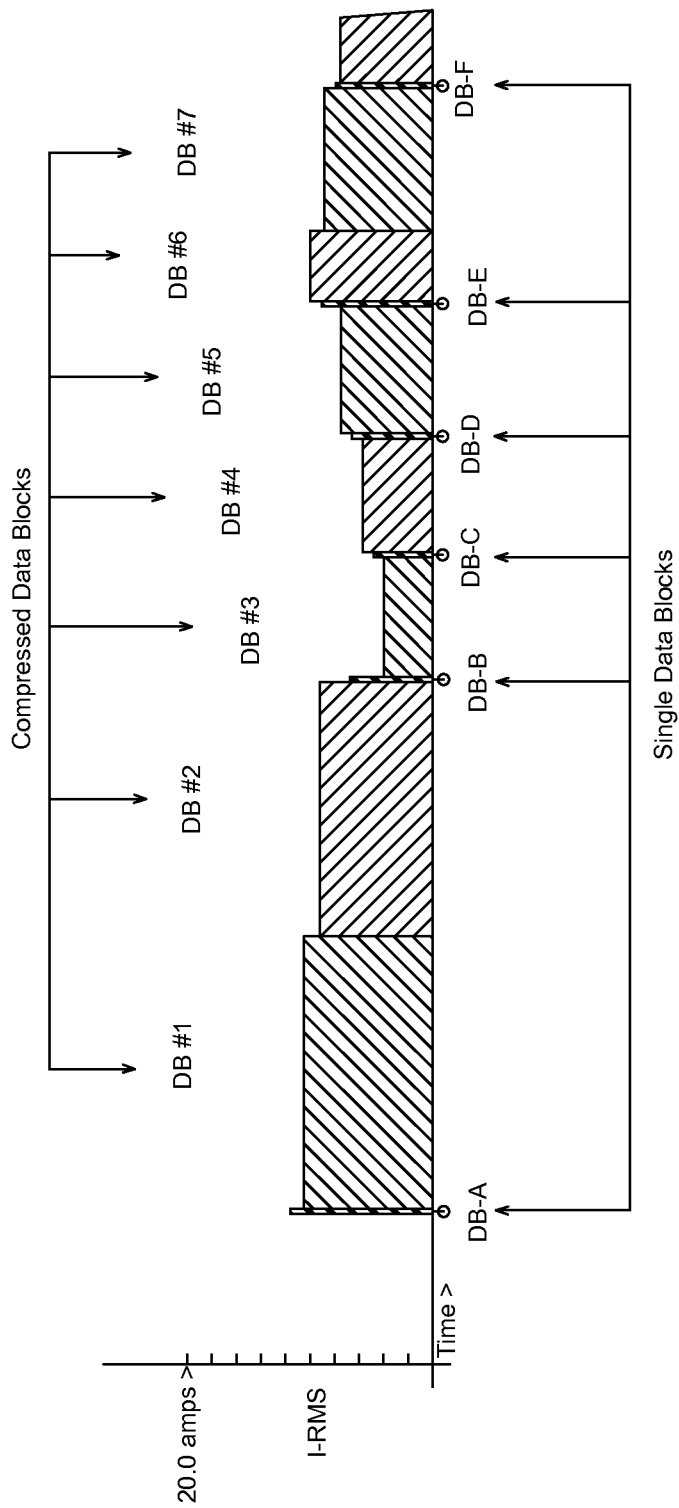
FIG. 9 is a detail view of a portion of FIG. 8.

FIGS. 8 and 9 graphically represent a load profile of I-RMS. FIG. 9 is a detail of a portion of FIG. 8 showing enlarged detail. In this figure, there are single data blocks (DB-A-DB-F) and compressed data blocks DB#1-DB#7. The data block values used in defining the operational characteristics for a load cycle, and consequently, the construction of a load profile are taken from the current half of the data block and are listed below for clarity. As discussed below under data block compression, the data blocks in FIGS. 8 and 9 are explained as follows. All load profiles begin with a single data block. As data is accumulated, steady state periods are compressed (again, as discussed below). Such data blocks are accumulated until conditions change at which point, another single data block is captured. Once again, after a steady state is achieved, the data blocks compress again. This is clearly shown in FIGS. 8 and 9.

There is one important caveat to consider when monitoring load cycles for the creation of a load profile. That is that the load cycles should be representative of a healthy load at an initial stage. A load calibration of some kind should be performed at the time of the initial monitoring to insure that the load is functioning correctly and within acceptable limits. This ensures that the initial load cycles monitored and the subsequent load profiles developed are reflective of a healthy load and suitable for baseline comparisons to future load cycles.

Although FIG. 9 shows I-RMS values, the load profile is developed for all of the values in a given data block (see FIG. 7).

Values taken from current part of data block are:

Max Peak current;

Average I-RMS;

I-RMS standard deviation;

Power factor; and

Compression length in time blocks (Accumulated Time).

In addition to the above values used to describe a load, the current's Total Harmonic Distortion (THD) is included. This value is derived by analyzing the sampled current waveform values contained in the current block that was transmitted to the multi-channel recorder's database during data block compression. The multi-channel recorder's database takes these sampled waveform values and calculates a fast Fourier transform to determine the current's THD, at that current level.

Once a load cycle begins, the multi-channel recorder's database takes the electrical values in the current half of the compressed data blocks, plus the current's THD and begins to calculate the load cycles baseline values. These values are used to define the load's operational characteristics and are listed below.

Four values that define the operational characteristics of a load cycle:

load cycle average RMS current, (I-RMS) and its standard deviation;

load cycle average power factor and its standard deviation;

load cycle average current THD and its standard deviation; and load cycle average data block I-RMS standard deviation and its standard deviation.

As touched upon earlier, the operational characteristics of an electrical load are fundamentally defined by how the load draws current from a source of electrical supply. Measuring the three basic current elements, the RMS current, power factor and current THD, over the course of a load cycle and relating these values to each other describes the inherent qualities that characterize that load.

Figure 10:
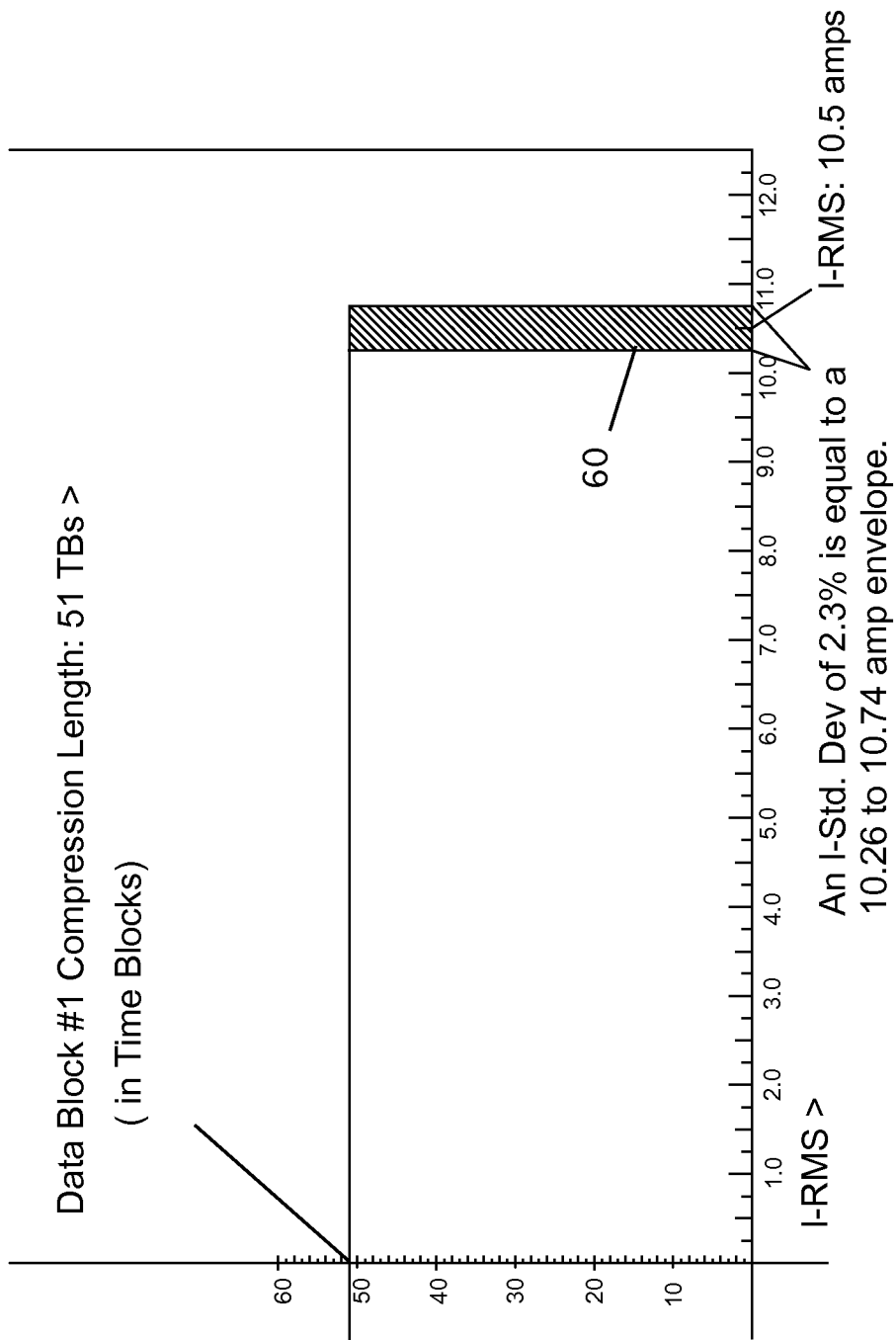
FIG. 10 is a graph showing the data associated with data block 1 of FIG. 9.
Figure 11:
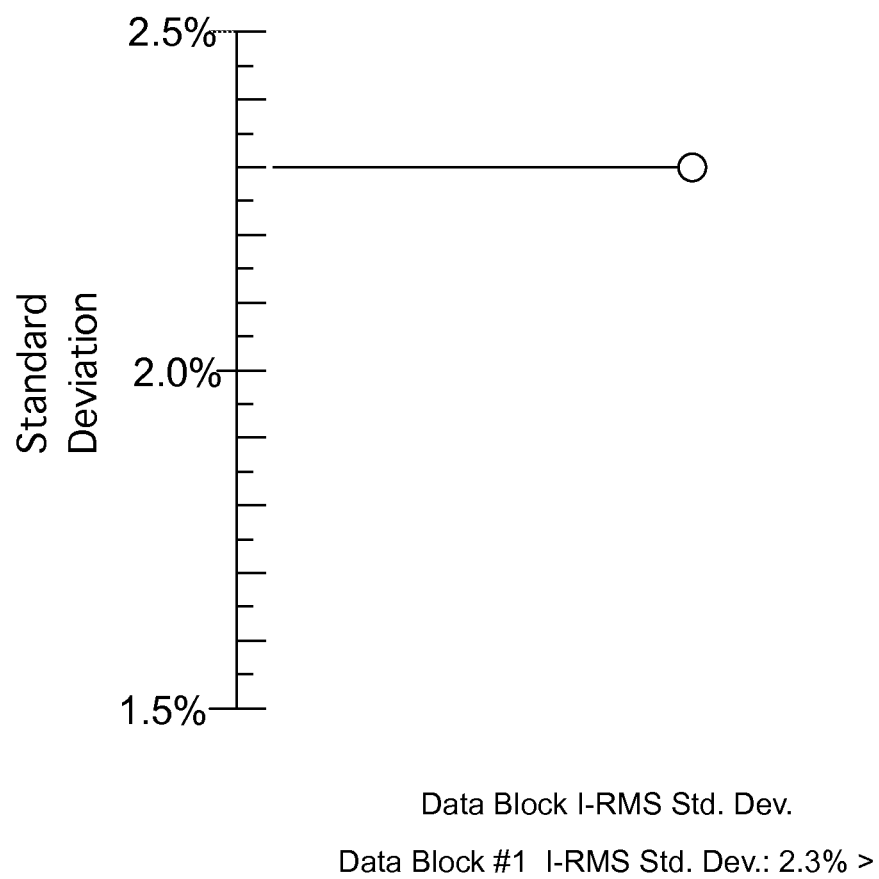
FIG. 11 is a graph showing the I-RMS standard deviation for data block 1 of FIG. 9.

The fourth value used in defining the operational characteristics of a load is the I-RMS standard deviation value measured for each compressed data block contained in the load cycle. As explained earlier, this is a measure of the average variance of the RMS current measured for that data block and quantifies its volatility. This value is averaged over time and used as a gage to denote the relative stability or volatility of the load in how it draws current during a load cycle. A sudden increase in this value would indicate an increase in the volatility of the current and indicate a potential disequilibrium occurring within the load. FIG. 10 shows an example of how the current standard deviation can be used when examining data block #1 of FIGS. 8 and 9. In this case, the vertical component is time (measured in time blocks). The average current for this data block is measured at 10.5 amps. (See FIGS. 8 and 9). For a current standard deviation of 2.3%, there is an envelope 60 (shaded block) of between 10.26 and 10.74 amps. Thus, if the I-RMS exceeds these values, a warning is issued. The warning and alarm phases are discussed at length below. FIG. 11 is a graph showing the I-RMS standard deviation for data block 1 of FIG. 9 A data point at 2.3%).

Figure 11A:
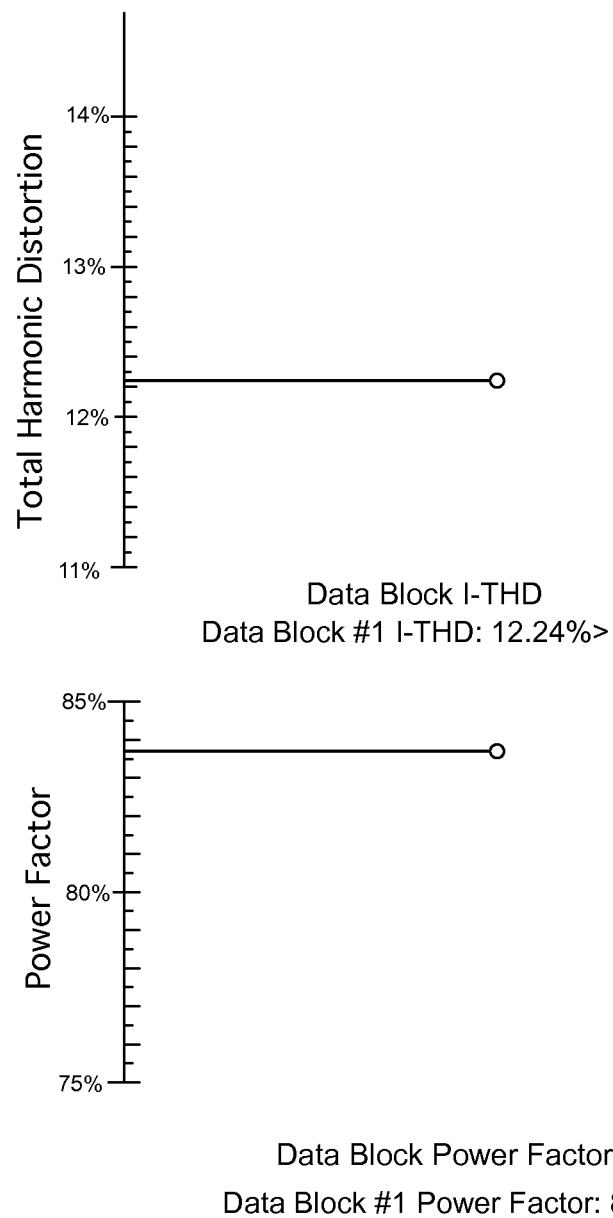
FIG. 11a is a graph showing the I-THD and power factor for data block 1 of FIG. 9.

Tying the power factor value, the current THD value and the I-RMS standard deviation value to their corresponding RMS current value provides a common frame of reference by which the relationship between these four variables can be quantified. Their average values, over the span of the load cycle, are used to determine the standard deviation for each variable, which is used in defining its corresponding operational boundary and thereby determining threshold values. This is explained below. FIG. 11a is a graph showing the I-THD and power factor for data block 1 of FIG. 9. Here, the I-THD of 12.4% and the power factor of 83.8% are shown as data points for data block #1.

Figure 12A:
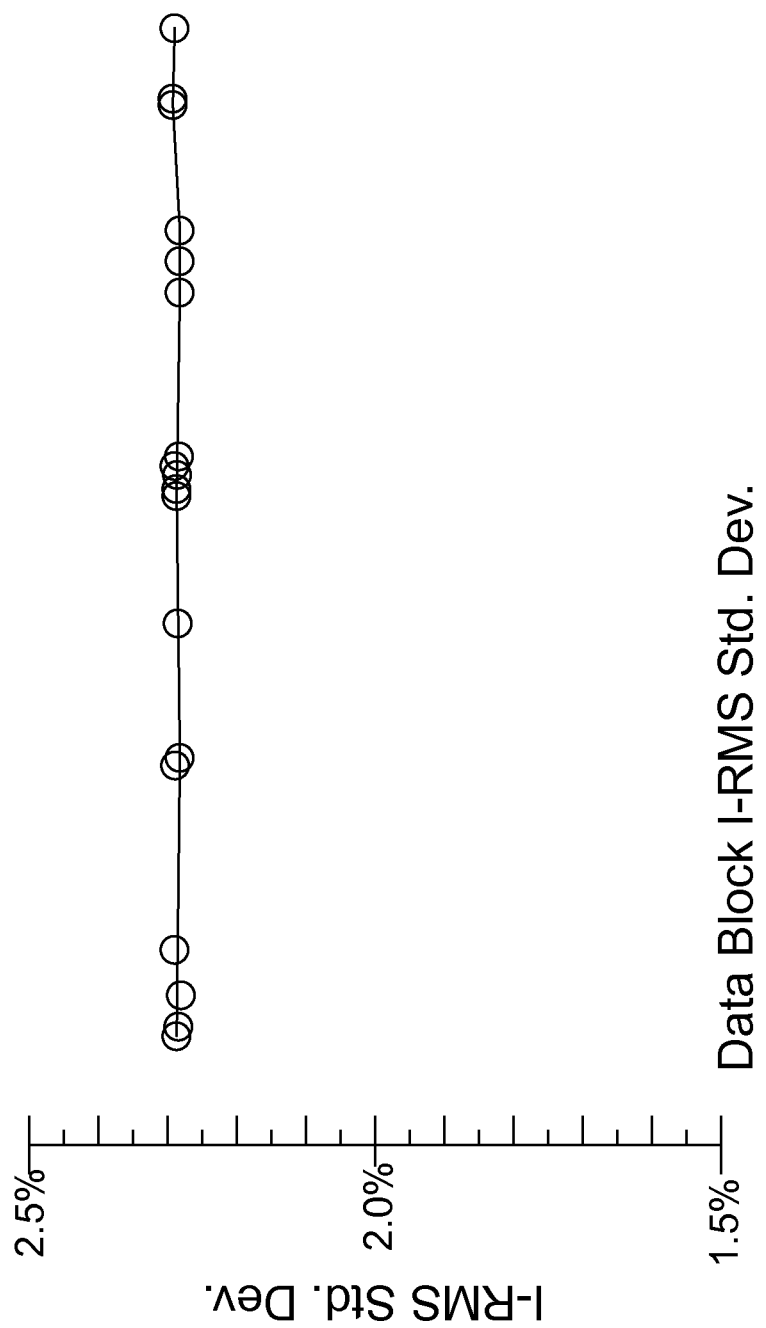
FIG. 12a is a graph showing the I-RMS standard deviations for the data blocks shown in FIG. 9.
Figure 12B:
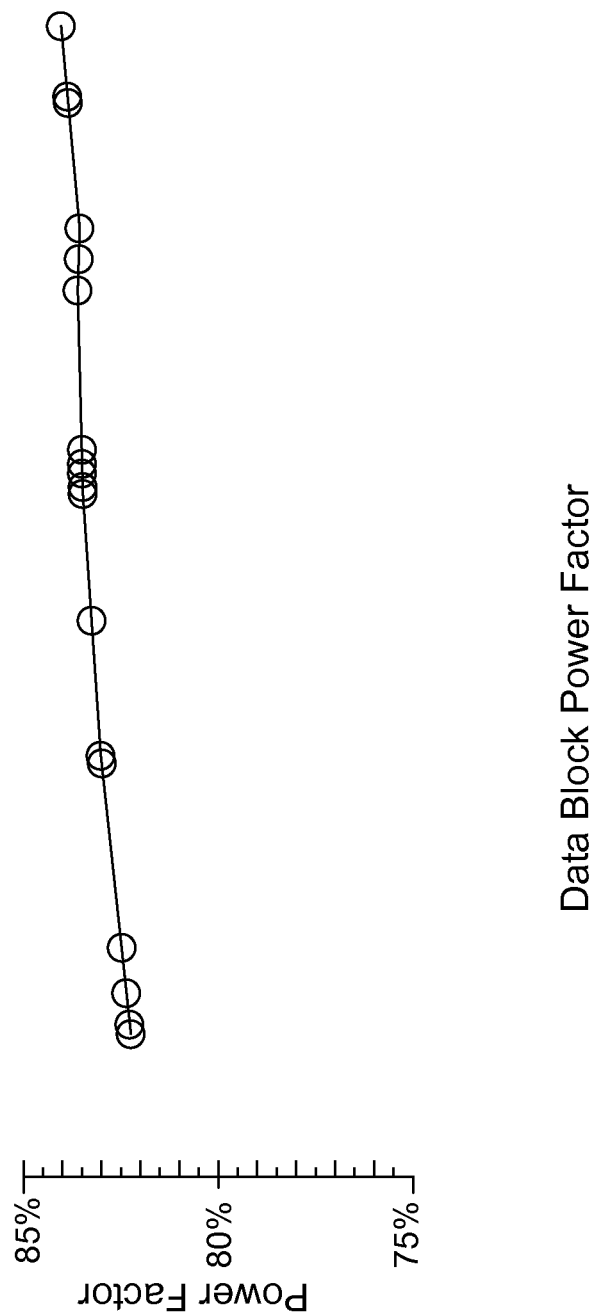
FIG. 12b is a graph showing the power factors for the data blocks shown in FIG. 9.
Figure 12C:
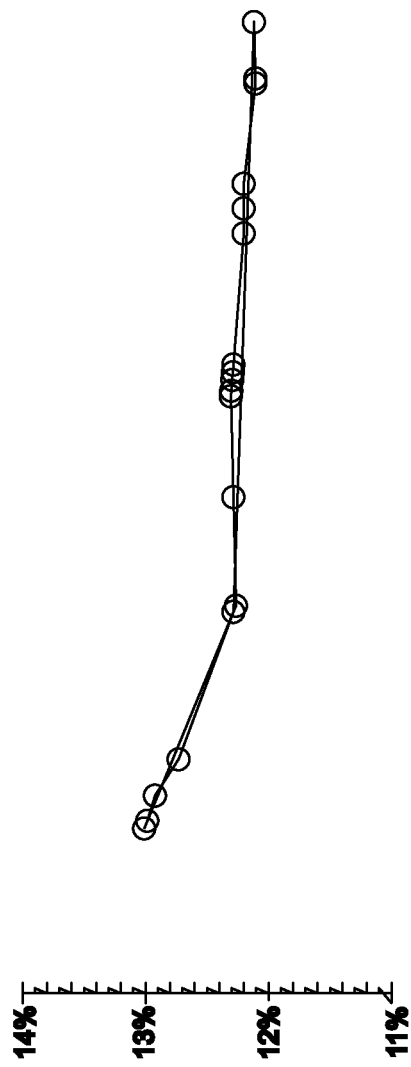
FIG. 12c is a graph showing the I-THDs for the data blocks shown in FIG. 9.

In the same way, the data points are derived for the other data blocks from FIG. 8. FIG. 12a is a graph showing the I-RMS standard deviations for the data blocks shown in FIG. 9. This shows a relatively linear graph over the load profile. Similarly, FIG. 12b is a graph showing the power factors and FIG. 12c is a graph of the I-THD for the data blocks shown in FIG. 9. In the same manner, data points can be generated for any desired value from any particular load profile.

Taking the average I-RMS value of each of the compressed data blocks contained in the load cycle and multiplying it by its respective data block length, in time blocks generates a load cycle average I-RMS. These individual values are then added together, the total of which is then divided by the number of compressed data blocks contained in the load cycle to derive the average I-RMS value for that load cycle. Once the load cycle's average RMS current value is known, its standard deviation value is calculated. The object of this is to derive an operational boundary for the load cycle RMS current.

Figure 13A:
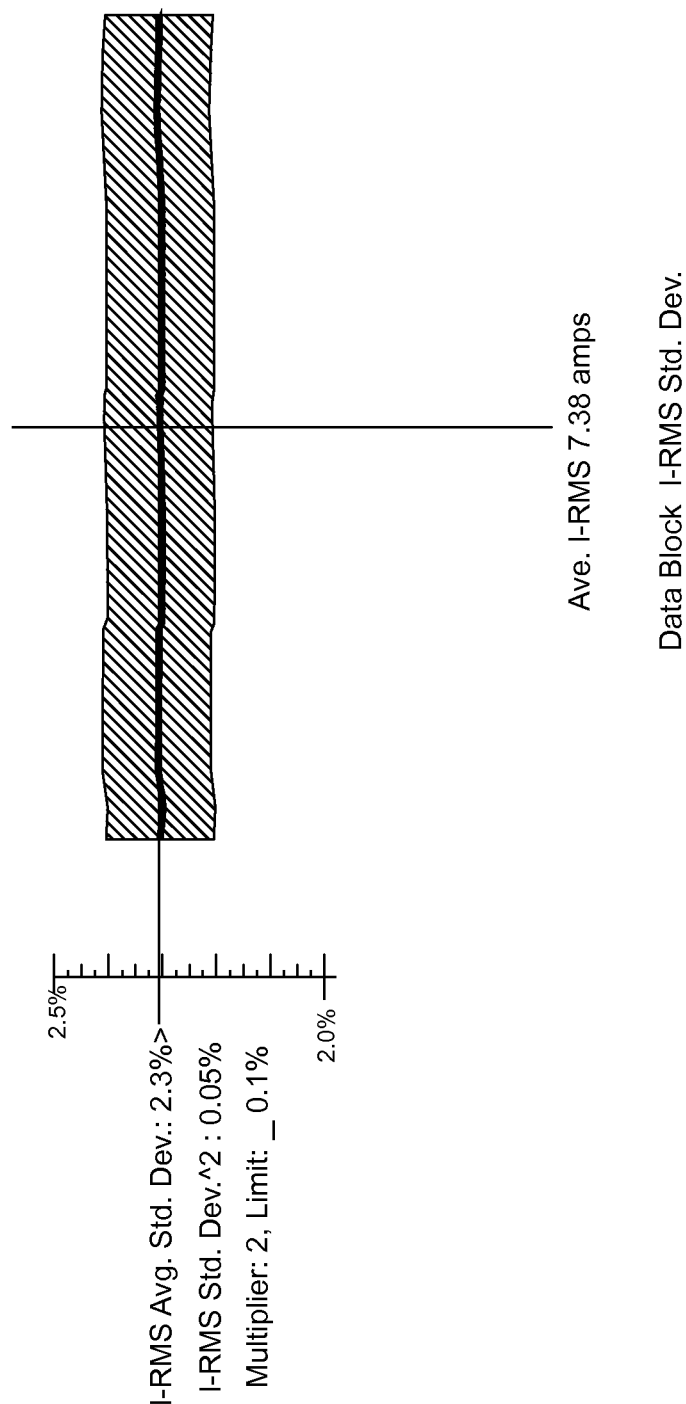
FIG. 13a is a graph showing the IRMS standard deviations and multiplier limits for the data blocks of FIG. 9.
Figure 13B:
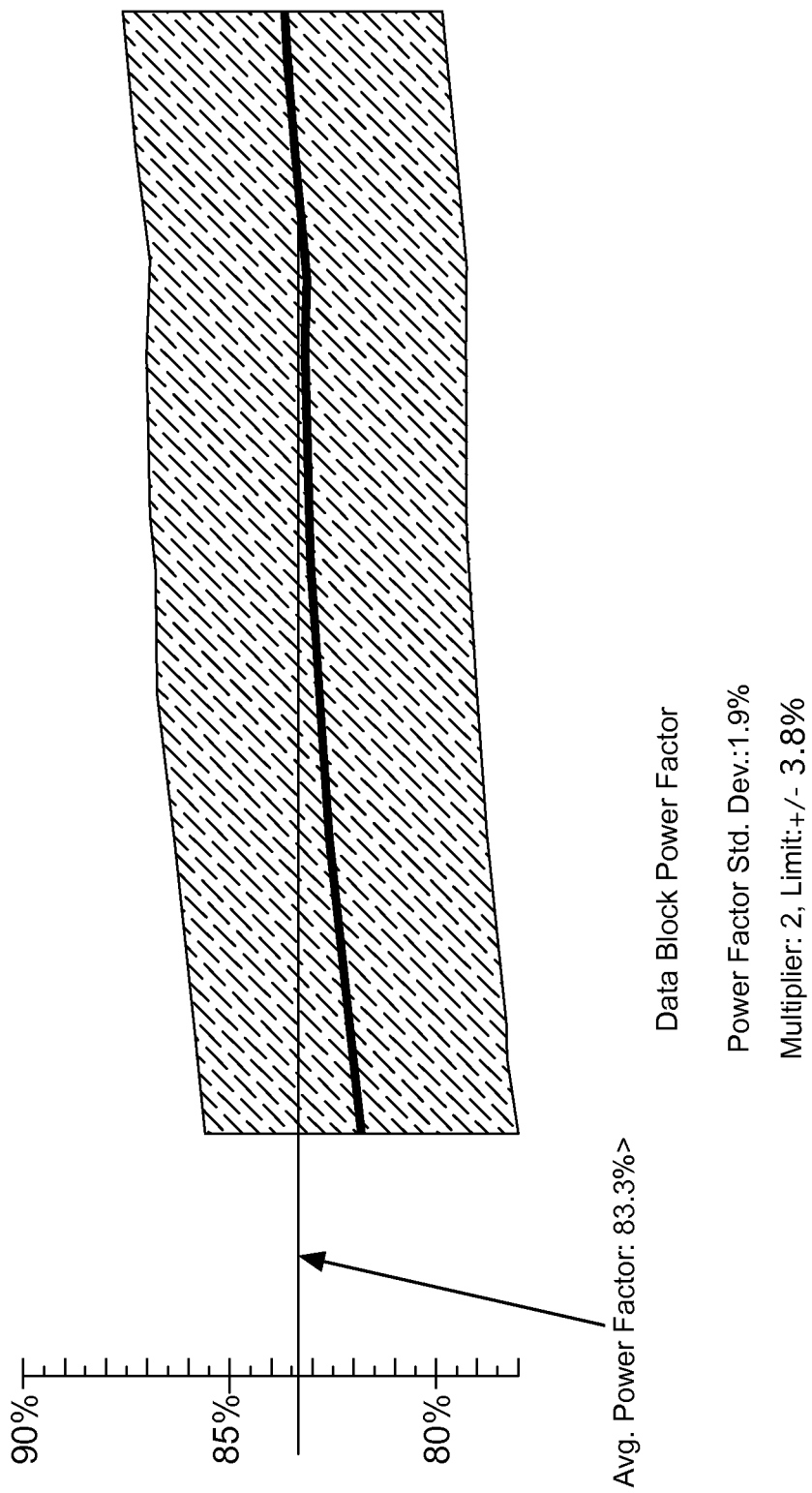
FIG. 13b is a graph showing the power factor and multiplier limits for the data blocks of FIG. 9.
Figure 13C:
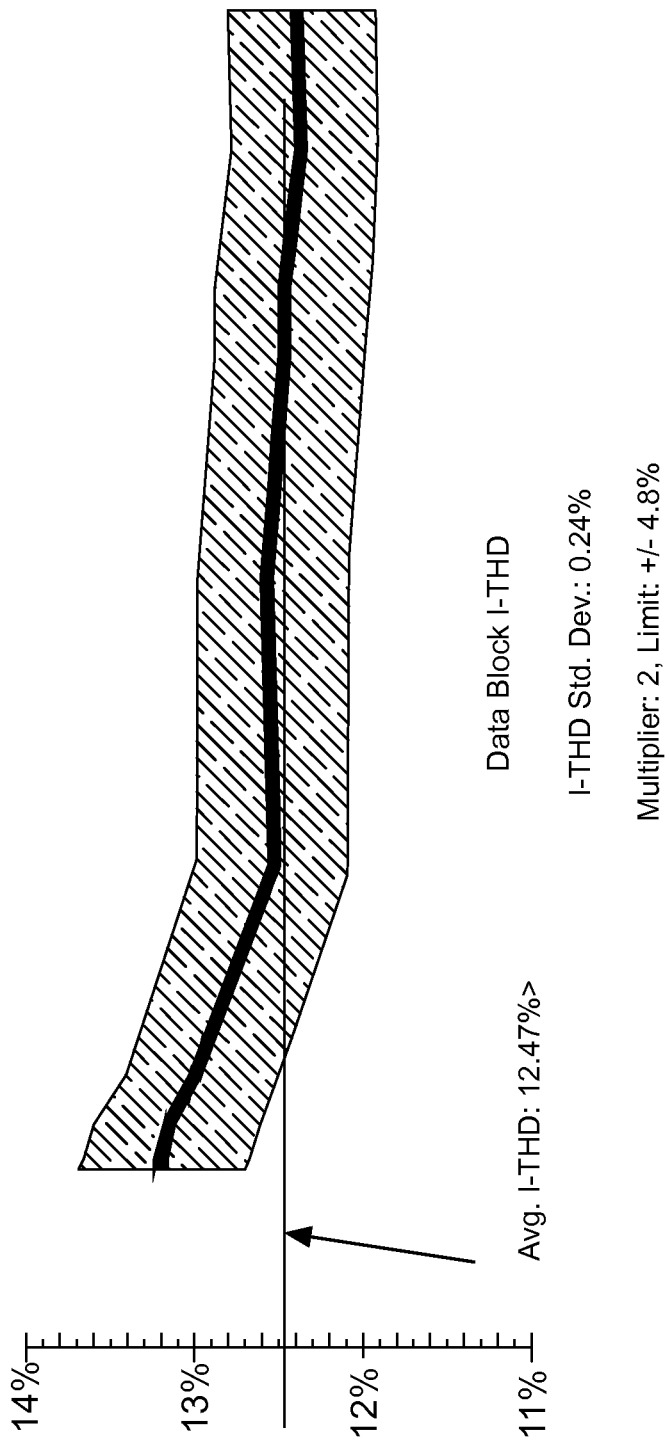
FIG. 13c is a graph showing the I-THD and multiplier limits for the data blocks of FIG. 9.

FIG. 13a is a graph showing the IRMS standard deviations and multiplier limits for the data blocks of FIG. 9. Note that the upper and lower limits shown are the operational boundary for the load cycle RMS current. Similarly, FIG. 13b is a graph showing the power factor and multiplier limits for the data blocks of FIG. 9 and FIG. 13c is a graph showing the I-THD and multiplier limits for the data blocks of FIG. 9.

Using the standard deviation to derive the operational boundary for the variable in question permits the system being monitored to define itself rather than using some predetermined static value. This is important because each load must be considered as unique if accurate load profiles are to be developed that define the operational boundaries of the load. The standard deviation also facilitates the ability to automate this function because the operational boundary of a load defines the threshold values that are used to drive the automated predictive analysis method.

Adding a multiplier to the standard deviation number creates a means for the automated predictive analysis method to automatically manipulate the sensitivity of the system. This allows for the possibility to actively control, by widening or narrowing the width of the operational boundary and thereby adjusting the corresponding threshold values. This process acts much like the focusing of a lens, allowing the analysis method the ability to adjust the sensitivity of the monitoring system in response to the changing analytical needs that circumstances may dictate.

As an example, the standard deviation multiplier for the RMS current is set at 2, which would set the operational boundary used by the load analysis to the $2^{nd}$ standard deviation value. This would create an operational envelope that encloses approximately 95% of the compressed data blocks contained in the load cycle, based upon the Gaussian distribution model. This means that, at this setting, less than 3% of the load cycle's data blocks should fall on either side of this operational envelope. This 3% equates to a period of time, since data blocks are a collection of time blocks.

Looked at in this way a percentage of a load cycle's data blocks represents a period of time as well as a quantity of the variable. Relating the quantity of a variable to a percentage of a load cycle provides a means for time to be used as a qualifier in the determination of a system's response to a variable's movement beyond a threshold value. Adjusting the threshold value would automatically adjust the amount of time used as a qualifier. Referring to this example, an RMS current value that exceeds the $2^{nd}$ standard deviation boundary must also exceed it for more than 3% of the total load cycle duration in time blocks to activate a notification response by the system.

The load cycle's average power factor, average current THD, and average data block I-RMS standard deviation with their respective standard deviation values are calculated in the same way as the load cycles average I-RMS explained above. The intent is the same as above, to automatically establish their respective operational boundaries and define their threshold values. The standard deviation multiplier for each variable can be independently set and automatically controlled by the system. This provides the means to automate the control of the respective threshold values, there by adjusting the sensitivities of the system automatically in response to changing environmental factors.

The relationship that exists between a load's instantaneous RMS current value and its corresponding power factor, current THD and the data block I-RMS standard deviation values are important and must be appreciated to understand how a load profile is developed. This relationship is defined during the formation of each compressed data block created during a load cycle, when a particular value of a load's RMS current is associated with a corresponding value for power factor, current THD and the I-RMS standard deviation. The automatic creation of compressed data blocks over the span of the load cycle provides the system with the information required to develop the operational boundaries that determine the threshold values for each load cycle.

The load cycle's power factor, current THD and the data block I-RMS standard deviation values are related to and dependent upon the load cycle's I-RMS value. That is to say, for every I-RMS value, there is associated a particular power factor value, a current THD value and a data block standard deviation value.

While a load cycle's power factor threshold limit is the same percentage value over the span of a load cycle, the power factor value associated with 4-amps of RMS current may be quite different than the power factor value associated with 10-amps of current. Because the threshold limits are defined based upon the standard deviation of a variable, given as a percent of variance, times a multiplier, the actual limiting values of a variable is dependent upon the value that is associated with a particular RMS current value. For example, the power factor limit for the load profile in the above example is +3.8%. The power factor associated with 4-amps of RMS current is 82%. This means its operational boundaries or limits are defined as 82%±3.8%. This equates to an upper boundary of 85.1% and a lower boundary or limit of 78.9%. Each of these associated values must fall within the acceptable threshold limits determined by their operational boundaries or the automated predictive analysis system initiates a programmed response.

Fault prediction demands the development of indicators that forewarn of potential problems prior to their occurrence. The use of standard deviation to quantify the volatility of the voltage and current values measured over time is meant to be such an early warning indicator. This is based upon the premise that electrical systems are dynamic systems; they must achieve some reasonable degree of equilibrium to sustain their operation. The average measured variance with respect to time of the voltage and the current variables for an electrical load describes that system's unique state of equilibrium by quantifying its volatility/stability. The quantifying of the equilibrium that characterizes an electrical load is expressed as an indicator based upon measuring the load cycle's stability called the load cycle stability index.

The load cycle stability index: =stability metric
%–avg. load cycle I-RMS standard deviation
%.

The stability metric % is calculated by taking the number of time blocks represented by the compressed data blocks contained in the load cycle and dividing that number by the total number of time blocks contained by the load cycle.

The load cycle average I-RMS standard deviation is used for the avg. standard deviation % in the above equation. Using the above load cycle example for FIGS. 13a-13c, the stability metric % is equal to 3,846 compressed time blocks/ 3974 total time blocks, X 100, which equals 96.78% (compressed time blocks are discussed in greater detail below).

Subtracting the avg. load cycle I-RMS standard deviation of 22.5% from the Stability Metric of 96.78% produces a load cycle stability index of 74.28%. Because a load profile is comprised of several load cycles, the load cycle stability index for a load profile becomes an average value with a standard deviation. This develops the operational boundaries for this indicator.

One problem is that the greater the advance warning such an indicator provides, the greater the likelihood that it will produce some percentage of false alarms. It is the nature of dynamic systems to experience transient conditions during the normal course of an operational cycle that can trigger early warning indicators. For this reason, such an indicator tends to generate an alert instead of a warning or an alarm.

For each load cycle there are maximum and minimum values. These values are taken from the single and compressed data blocks that make up a load cycle (see FIGS. 8 and 9). They simply indicate the maximum and minimum values recorded for the peak and the I-RMS current measured during the load cycle. The maximum peak current and I-RMS values are typically measured during the initial start up of the load and are therefore generally contained in the first data block of the load cycle, which is a single data block most of the time (again see FIGS. 7, 8 and 9).

As discussed above, a load profile is the result of taking the operational characteristics that are defined by a load cycle, and averaging them over several load cycles. This action is designed to produce the historical baseline references that the automated predictive analysis is predicated upon. The load profile includes the four main elements that define the operational characteristics of a load cycle, as described above, plus the load stability index described above. The list is included below for clarity:

Five Elements that define the operational characteristics of a load profile:
the load profile average RMS current, (I-RMS) and its standard deviation;
the load profile average power factor and its standard deviation;
the load profile average current THD and its standard deviation;
the load profile average data block I-RMS standard deviation and its standard deviation; and
the load profile stability index.

The load profile's stability index calculated above does not reflect a standard deviation or limit value because the example load profile is made up of only one load cycle. Multiple load cycles are needed to produce the standard deviation and associated limit value for this load profile element.

The load analysis provided by the automated predictive analysis system produces three levels of automated response and/or notification. They are listed here in order of their status of severity:

Alarm status level: the most severe status level, indicating an immediate need for response to a system problem. This threshold is defined as outlined in the predictive analysis region section below.

Warning status level: a reduction in the level of severity as compared to the alarm level. This indicates that there is some amount of time that exists before the event reaches the alarm level. This threshold level is also defined in the predictive analysis region section below.

Alert status level: this level is intended to provide early notification of conditions occurring that support the potential for future warnings or alarms.

The avg. I-RMS element of a load profile defines the standard deviation envelope that is used to determine the boundaries of the predictive analysis region. Because of this, the limits derived by this element are responsible for the initiation of all alarms and warnings generated by the automated predictive analysis system with regards to load analysis.

The other four elements of the load profile (see above) are responsible for generating the various alerts that notify the end user of potential problems that are developing with regards to the load.

The limiting values produced by a load profile's power factor, current THD, data block I-RMS standard deviation and load cycle stability index create the possibility for several kinds of alerts, with different levels of relative urgency. For example, a sudden change in power factor of a load beyond its limiting value could be considered more meaningful than the change in the load cycle stability index. As well, the movement of two or more of the load profile's elements beyond their threshold limits would be more meaningful than if just one element did. Ultimately, the characteristics of the load must be taken into consideration when developing a hierarchy for these different alerts. The many different possible combinations provided by these four load profile elements creates the potential for characterizing the unique way that a load responds to conditions that ultimately drive it to alarm status. Over time, the accumulation of data for a given system provides information that is unique to that system and provides the system with the ability to predict problems for that system.

Figure 14:
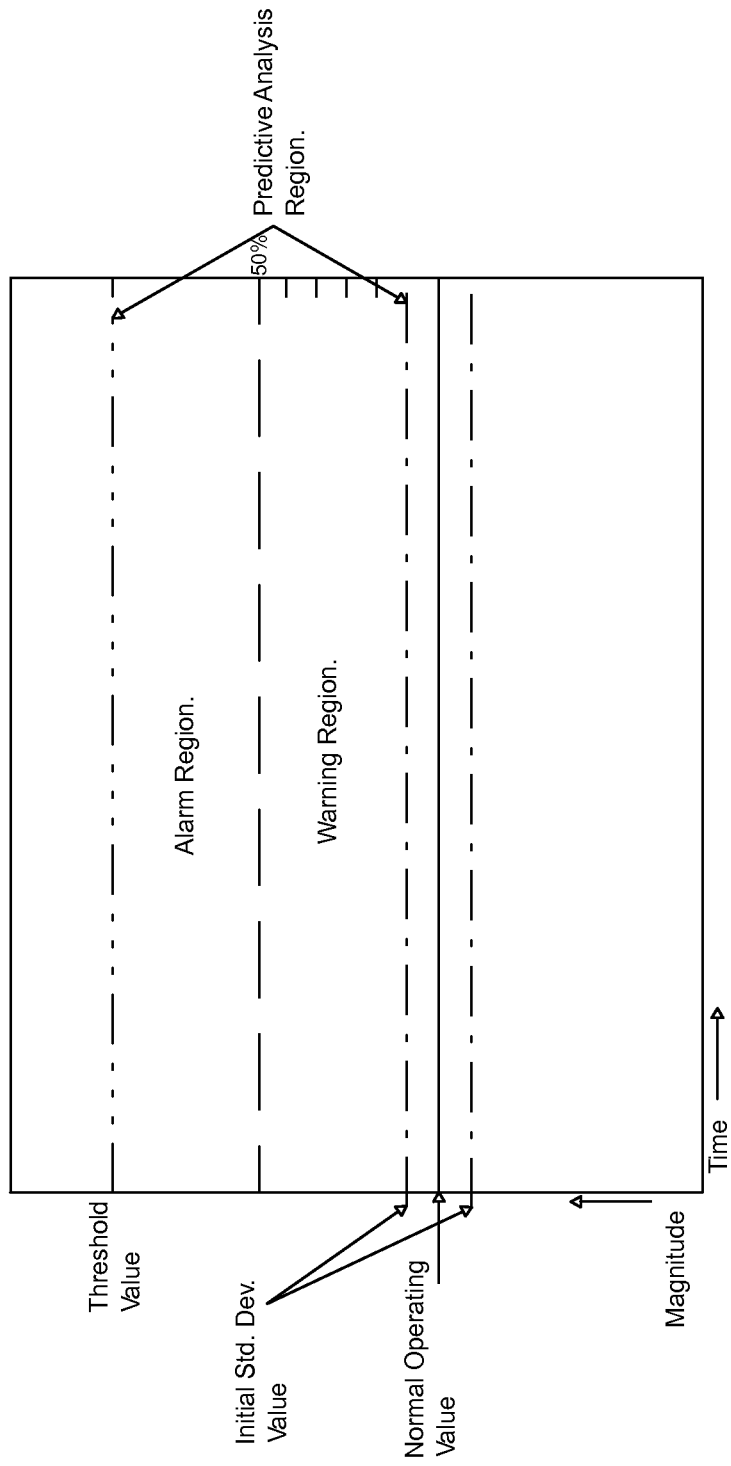
FIG. 14 is a graph of the predictive analysis region in relation to the threshold value and the normal operating value.

FIG. 14 is a graph of the predictive analysis region in relation to the threshold value and the normal operating value. This graph shows the different regions of operating values that are used to issue the various warnings and alarms. The values for these limits are determined by the specific parameter being measured. The graph is a template having magnitude of a parameter on the vertical axis and time as the horizontal axis. A horizontal line labeled "Initial average value" (in this case I-RMS current) is placed at the appropriate level on the vertical axis. Two lines around this normal operating value represent the standard deviation from that normal value (+/−). At a determined point above the highest initial standard deviation is a dashed line. The space between these two lines is labeled the "warning region". Above that is another dashed line that marks the threshold value for the alarm region.

Thresholds represent operational boundaries and for that reason tend to be static or fixed in nature. Using the standard deviation to quantify the stability or volatility of an electrical variable allows for the earliest possible notification of a change in the normal operating parameters as defined by that electrical variable. The range or region between the upper boundary of the standard deviation envelope and the threshold value provide a period of time to analyze and determine the meaning of a change in operational states of an electrical variable. Once analysis is complete, predictions can be made.

Electrical variables tend to be dynamic and may have many operational states. For this reason, a warning region (and as discussed even an alert region when needed) is used, which defines the bottom half of the predictive analysis region. This warning region is an acknowledgment that electrical variables, will occasionally vary beyond the standard deviation envelope and into the predictive analysis region. Most of the time this is a transient condition and the variable moves back to adopt its normal stable measure. The warning region also acts as a buffer zone to prevent spurious false alarms. Moreover, the warning region provides the space for the change in the trend of a variable to be confirmed. The predictive analysis method is designed to provide a complete analysis and a fault prediction prior to the variable moving into the alarm part of the predictive analysis region.

Figure 15:
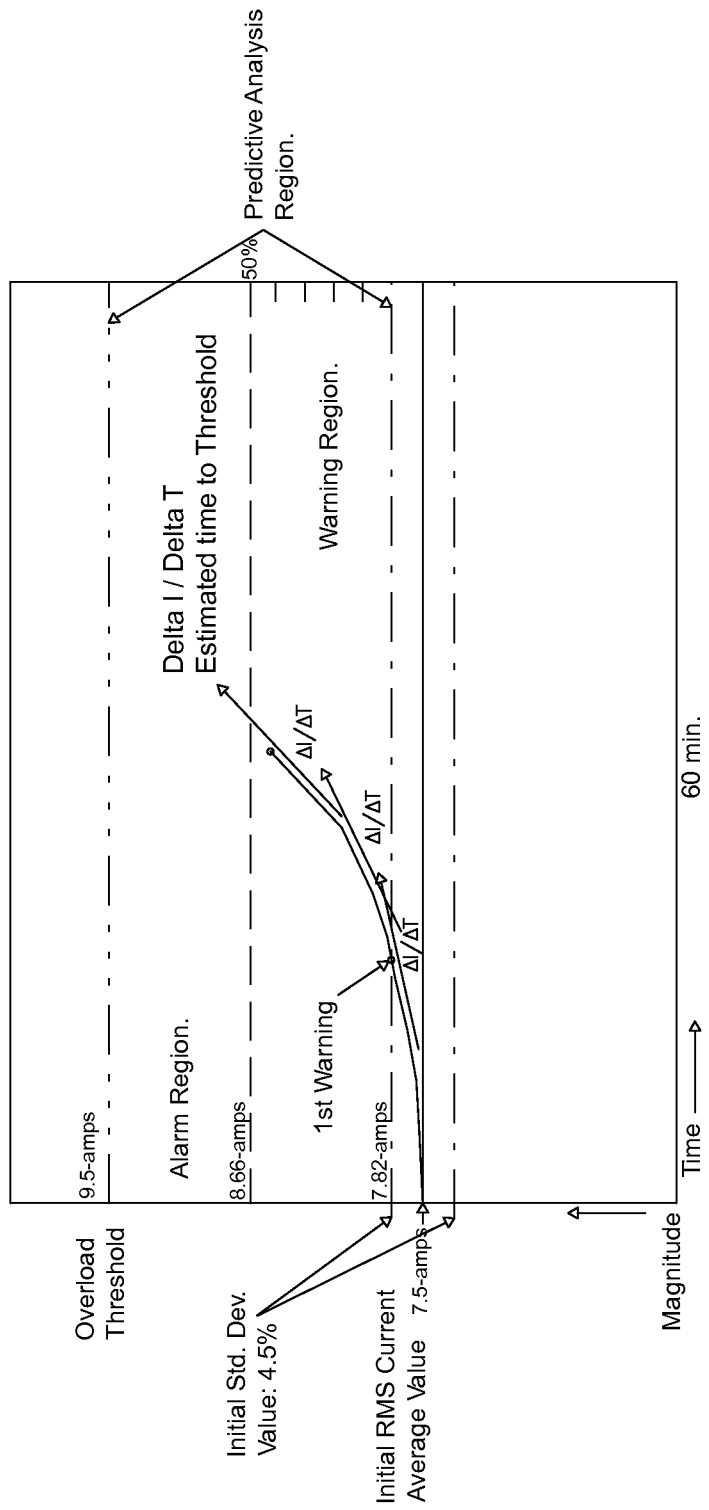
FIG. 15 is an example of the trended RMS current moving into the predictive analysis region.

FIG. 15 is an example of the trended RMS current moving into the predictive analysis region. Here, the change in current over time ($\Delta I/\Delta T$) is plotted. A single occurrence of the $\Delta I/\Delta T$ moving into the warning region produces an alert. A continued movement or repeated incursions into the warning area generates a warning. A move into the alarm region obviously produces an alarm. However, as discussed below, one of the unique advantages of this system is that it not only detects warning and alarm levels, it is also able to predict failure using trend analysis, as discussed below to forecast a time to overload or failure.

The use of prediction, as is used herein, implies being notified that a problem exists before the threshold that defines the problem is crossed. As discussed above, this system attempts to qualify the measured value that lies between the upper boundary of the standard deviation envelope, defined by the electrical variable and the threshold value (see FIG. 14). An example of this process is described below, with reference to FIGS. 14 and 15.

Step 1: create user defined alarm threshold values for the monitored load being monitored. These values are derived from the operating and performance specifications for the monitored load in question, information that is supplied by the manufacturer. Additional thresholds include NEC specified operational limits for the branch circuit supplying the critical load as well as other industry acknowledged operational limits for the specific kind of load being served, (e.g., NETA Acceptance and Performance testing criteria, etc.) These threshold values define the operational limits for the monitored load and are programmed into the graphical user interface described above during the commissioning and start-up of the monitored load. (See FIG. 13 for an example using a motor as the monitored load.) All threshold values are programmed into both the PQ-Node and the multi-channel recorder.

Step 2: Establish normal operating parameters for the monitored load being monitored. This is done by measuring and recording all pertinent electrical values during the start-up and commissioning of the monitored load. This includes every electrical element recorded in the data block. The standard deviation for each of the electrical values referred to in the data block is also measured and recorded. The standard deviation of the electrical variable takes into account the impact that the environment can have on the electrical element being monitored over time. These values are used as a baseline for the predictive analysis and functionally define what the stable operational state of the monitored load is.

Step 3: Subtract the normal value and the standard deviation value for each of the electrical elements derived in step two from the alarm threshold values for that electrical element defined in step one. This value represents the magnitude of the predictive analysis region. (See FIG. 14).

Step 4: The first warning level is reached when the average value of an electrical variable moves beyond the standard deviation envelope and into the predictive analysis region. As an example, the monitored load in this case is a three-phase motor with a nameplate rating of 7.6-amps. The testing and monitoring performed at commissioning and start-up established a 7.5-amp average RMS current value for its normal operating level. The initial standard deviation for this measure is 4.25%. This means that the initiation of the predictive analysis region and the first warning level is when the average value of the RMS current for the motor moves beyond 7.82-amps.

The overload threshold for this example is established either by manufacture's specifications or by the monitored load's branch circuit rating, whichever is least in value. For this example, the overload threshold is set by the National Electrical Code for overload protection of a motor, which is 125% of the motor's nameplate rating, or 9.5-amps. The predictive analysis region is then defined as the area lying between 7.82-amps and 9.5-amps (see FIG. 15). The magnitude of the predictive analysis region in this example is 9.5 minus 7.82, or 1.68-amps. The first 50% of this region is designated the warning region and the second 50% the alarm region. Using this example, the warning region extends from 7.82-amps to 8.66-amps. The alarm region extends from 8.66-amps to 9.5-amps. The warning and alarm values as well as the threshold values are stored in the PQ-Node as well as in the multi-channel recorder. When an electrical variable moves into the predictive analysis region, the initial warning that is generated is generated in the PQ-Node in question, and the warning information is sent immediately to the multi-channel recorder via the alarm transmission mode described above. In this way, the multi-channel recorder is not waiting for the data to be sent to it in the normal flow of data blocks transmitted via the data logger transmitter, but instead receives the warning immediately, via the alarm transmitter.

Step 5: Once an electrical variable moves into the predictive analysis region and a warning is generated, the rate of change of this variable is tracked and updated continuously by the PQ-Node. The first prediction generated is that of an estimated time for the variable to reach the alarm region value, (in this case 8.66-amps), and the Overload Threshold value, which in this case is 9.5-amps. The warning is displayed at the system terminal monitors (discussed below) and is updated at every 10% increase in the value of the electrical variable in question. The monitor displays the monitored load with a warning/alarm status box and color bar demonstrating the severity of the warning. A green color represents a system normal status. A warning status starts with the color yellow and rises to various deeper shades of orange until it hits the 50% level, which is the alarm region, where it turns red in color. This part of the analysis provides continuously updated predictions of the estimated time remaining before the electrical variable reaches the threshold value and is performed by the PQ-Node, with the warnings and alarms being sent to the multi-channel recorder. All warning and alarm reports are saved in the multi-channel recorder in a report log that is created for each monitored load that this system is installed to monitor. These reports become part of the historical record and are used in future analysis of the monitored load.

Step 6: Once the multi-channel recorder has been alerted to the specific warning by a PQ-Node that one or more electrical variables have moved into the predictive analysis region, it begins polling data from the other PQ-Nodes that have been installed to protect the monitored load. It identifies the PQ-Nodes relevant to the analysis to be performed based upon the installation of the PQ-Nodes into the graphical user interface described below in the Electrical distribution Analysis description. (See FIG. 19) In this example, the load in question is a three phase motor load, requiring the multi-channel recorder to poll the other PQ-Nodes monitoring the other two phases of the distribution system for comparison; both at the branch circuit and at the feeder and main service. All PQ-Nodes installed in the graphical user interface for that particular monitored load are polled and the data compared and analyzed. (See FIG. 19)

The first priority for the multi-channel recorder is to isolate the basic cause of the problem by determining whether the problem originates in the electrical distribution system, the motor or in the mechanical load that the motor drives. In this example, the multi-channel recorder first compares the latest source impedance values from all of the PQ-Nodes related to the monitored load in question to their respective historical averages and in this case finds that all of the source impedance values fall well within their established standard deviations envelope. The multi-channel recorder then compares the RMS voltage values measured at PQ-Nodes 3A, 3B and 3C, (see FIGS. 1 and 19), and finds the average of the three phases to be 120.0 volts with a standard deviation of 1.6%. This demonstrates a stable electrical distribution system and a fairly stable voltage supply. This indicates that the electrical distribution system is not the cause of the problem.

The multi-channel recorder then compares the RMS current, the power factor and load impedance values measured at PQ-Nodes 3A, 3B and 3C to the name plate data programmed into the software when the monitored load was commissioned. (See FIG. 19) In this case, the fact that only one of the phases went into alarm is indicative of an imbalance in the motor. Comparisons of the RMS current, the power factor and the load impedance for PQ-Nodes 3A, 3B and 3C reveal the probable cause for the initial high current on the one PQ-Node. (3A is the PQ-Node in alarm for this example) See table-5 below. The higher power factor and lower impedance measured in PQ-Node 3A is indicative of a stator winding that is beginning to fail, or shorting turn to turn. This reduces the inductive component in the winding, reducing the impedance, raising the power factor and consuming more power in the form of heat lost in the winding.

TABLE 1

Motor Overload Analysis Example

|  | Name Plate | PQ-Node 3A | PQ-Node 3B | PQ-Node 3C |
| --- | --- | --- | --- | --- |
| RMS Volts to GND. | 120 Volts | 118 Volts | 120 Volts | 122 Volts |
| RMS current | 7.6 Amps | 8.5 Amps | 7.36 Amps | 7.6 Amps |
| Power factor | 63% | 70.5% | 61% | 62% |
| Load Impedance | 15.79 ohms | 13.88 Ohms | 16.30 Ohms | 16.05 Ohms |
| Power | 574.6 Watts | 707.12 Watts | 538.75 Watts | 574.86 Watts |

Step 7: At this point, the multi-channel recorder has determined what the problem is and upgrades the overload warning to that of a motor failure prediction caused by a shorted winding in the stator. It identifies the problematic motor phase based upon the PQ-Node in question and estimates the time before the motor reaches overload status. It generates a work order to the maintenance staff or other responsible party detailing the above prognosis as well as identifying the location of the motor. The work order includes all pertinent motor information including the manufacturer, the motor model number, date it was installed and an estimate in labor and materials to repair. It continues to monitor the situation, upgrading the time to overload until the warning or alarm has been reset. The multi-channel recorder also quantifies the amount of energy lost during the period the motor has been malfunctioning. A complete copy of the report and work order is kept in the report log that is created for each monitored load monitored by this system.

This level of automated predictive analysis is completed almost as soon as it is initiated. The speed of an entry-level processor today runs the handful of routines required for comparative analysis quite quickly. In this example, the work order detailing the problem and solution and estimated cost of the solution are generated before the RMS current value ever reaches the alarm Region part of the predictive analysis region. (See FIG. 15) This is long before the overload threshold value is reached, which is the usual point when alarm notification is given.

Without the instant invention, the system shuts down the line when the automatic overload protection disconnects the motor, which would be the first indication that there is a problem.

Not every electrical problem can be predicted because some failures happen too quickly and do not afford the time to enact predictive or preventative measures. However, most electrical failures are preventable and that is the purpose of this invention.

The above discussion has used a number of terms such as standard deviation and compressed data blocks. The section below defines and explains how these terms are derived and used in the system.

Standard Deviation:

Applying the concept of standard deviation to the study of electrical variables is crucial to electrical fault prediction in the instant invention. Sampling an electrical variable over time produces a historical reference that becomes the most important comparative component to predictive analysis.

The first application of the standard deviation by the predictive analysis method is in the quantification of the volatility of the RMS voltage and RMS current as it is measured by the PQ-Node and recorded in each data block. As noted above, both the voltage and the current are measured over the full 12 cycles of a data block, producing 24 RMS values, each for the voltage and for the current. These values are squared to remove the negative component on the 12 negative waveforms and then added together. This value is divided by the number of samples (in this case 24) and then the square root is taken to produce a standard deviation value for the voltage and a value for the current.

The standard deviation equation used to define the volatility of a data block is defined as:

$$\sigma = \sqrt{\frac{(X-U)^2}{N}}$$

σ is the standard deviation

X is the RMS value of one of the 24 sampled current or voltage waveforms.

U is the average RMS value for the current or the voltage waveforms.

N is the number of sampled waveforms, 24 in this case.

The most basic quantitative assessment of an electrical variable sampled over time is the derivation of the variable's average value and standard deviation for that period of time. The standard deviation quantifies the stability, or volatility, of the baseline reference. This means that the standard deviation of a variable's baseline reference, used as a threshold, provides an early indication of a change to the functional characteristics of that variable with respect to its historical norm.

In addition, once calculated, the standard deviation is then divided by the average RMS value, multiplied by 100 to produce the percent of variation used in the comparison of electrical values for determination of data block compression. It is the percent of variation for the voltage and for the current that is used in determining the relative volatility of the data block. These two numbers, the voltage percent variation and the current percent variation determine the compression cycle for all data blocks. Unlike a threshold, which is a static value, the percent of variation is determined by the volatility of the 12 cycles of voltage and current measured in each data block. This makes the compression cycle functionally auto regulating, as the relative volatilities of the data blocks are compared and if the volatilities are alike they are compressed and if not, they are separated. This in affect divides time into sequential windows of volatility, which can be very useful in analysis. As noted above, a one hour span of time could have as many as 18000 data blocks produced by a single PQ-Node or as little as one, all depending on the degree of volatility and the change in volatility occurring in that hour as measured by that PQ-Node.

Additionally, a standard deviation can be applied when analyzing a group of like variables measured at different points on an electrical distribution system at the same point in time. The measure of each variable of the group is compared to the average measure of the group as a whole, and this deviation is then measured and trended over time. A change in the measured deviation of any one of the variables of the group with respect to the group as a whole can be significant.

The volatility of a variable is considered inversely proportional to the stability of that variable. If the volatility of a variable increases, then the stability of that variable decreases proportionately. As an example, the percent of variation explained above is used to directly define and quantify the volatility of the voltage and current values contained in a data block. If a data block has an average value of 123.2 Volts RMS and a 1.9% standard deviation, then the volatility of the voltage for that data block is quantified at 1.9%. Conversely, the stability of the voltage for that data block is considered to be 100%-1.9% or 98.1%.

Data Block Compression:

The reason for data block compression is to combine concurrent data blocks from the same PQ-Node that share the relative same electrical values and measured volatility and separate them from other data blocks of that PQ-Node that have greater or lesser degrees of volatility. This divides the time periods of each PQ-Node into sequential windows of varying degrees of volatility. Each window of volatility defined by the standard deviation measured for the voltage and current RMS values measured by that PQ-Node at the formation of the particular data block initiating that window.

A period of relative stability, where the electrical values measured by the PQ-Node are relatively static, all falling within the standard deviation set by the RMS voltage and current of the first data block initiating the compression cycle, may have a single data block representing the entire hour of monitoring. This might well occur if the load is turned off, of if the voltage is stable.

A period of considerable load shifting per hour will produce many data blocks, as the RMS current values will be fluctuating throughout the hour. This tells much about the load, giving specific real world operating parameters, linking the specific power factor and current THD values to a specific RMS current value.

PQ-Nodes that measure a transient voltage disturbance produce an RMS voltage standard deviation that is too large to meet data block compression criteria, and thus will stand apart as a lone 200-millisecond data block. Measured volatility in this way becomes a great tool for isolating moments in time and correlating them with specific locations on the electrical distribution system that measured the same volatile anomaly. This allows the analyst to look at the electrical distribution system as a whole, comparing the volatility of the voltage waveforms measured for specific time periods, and use this measure to identify the origin and cause of voltage fluctuations as they occur.

Like throwing a stone into a pond, if we have PQ-Nodes scattered around the edges of the pond, it doesn't matter whether we saw the location where the stone enter the water or not. The PQ-Nodes along the bank will register the ripple as it hits them, and comparing these ripples in time and comparing the relative location of the PQ-Nodes to each other will allow us to determine where the stone entered the water.

Data Block Volatility:

The volatility of a data block is defined by the relative volatilities of the voltage and current values measured for the period of time that the data block encompasses, 200-milliseconds being the shortest time period. Data block periods of longer than 200-milliseconds means that a period of relative stability has occurred. Because a data block's volatility is described by the relative volatility of two different variables, the voltage volatility and the current volatility, a definition and explanation of both follows.

Voltage Volatility is the average measured deviation of the RMS voltage over a 10/12-cycle period of time.

As explained above, the standard deviation of the RMS voltage is derived from the 10/12-cycle period of measured RMS voltage values in a data block. This standard of deviation measurement of the RMS voltage is the fundamental measure of volatility for the voltage variables of that particular data block. It is applied in percent value to the standard deviation measure itself, as well as to the average RMS voltage and the Delta-VRMS values of the data block in question. This creates an envelope of high and low threshold values for determining whether the data block is itself a candidate for compression and whether or not the data blocks that follow are suitable for compressing with it.

To use the VRMS standard deviation as a limit to data compression, the standard deviation of the voltage, must itself have a limit imposed upon it so that this combining and separating of data blocks based upon their relative volatilities can be achieved. To do this, the standard deviation of the first or initiating data block's V-RMS standard deviation is applied to itself to create upper and lower boundaries which are used as limits to determine whether the standard deviation of the data blocks that follow it are suitable for compression.

As an example, if the V-RMS standard deviation of the initiating data block is 1.9%, then the upper and lower boundary for the voltage standard deviation values of the data blocks that follow it must fall within the range of 1.9%±1.9%. In this case, this produces an upper boundary of 1.94% and a lower boundary of 1.86%. This standard deviation boundary is set by the first data block and does not change for the duration of time represented by that data block.

The V-RMS standard deviation also imposes limits on the mean avg. V-RMS values for data block compression. Using the above example, if the initiating data block records a mean avg. V-RMS value of 121.3 volts with a standard deviation of 1.9% then the limits imposed upon the mean average. V-RMS values of the data blocks that follow are 121.3 Volts, ±1.9%. This creates an upper boundary of 123.6 Volts and a lower boundary of 118.9 volts. Thus, the mean average V-RMS values for the data blocks that follow the initiating data block must fall within this boundary to be eligible for compression. This limit is established by the first or initiating data block and never changes for the duration of that compression cycle.

Similarly, the Delta V-RMS value of a data block also acts to limit to data block compression. If this value is too high, the data block cannot be compressed and remains a single data block. For example, the average RMS voltage is 121.3 volts and its standard deviation is 1.4%. A 1.4% variance in this case means a 3.4-volt wide operational envelope centered on the RMS mean of 121.3 Volts. The Delta V-RMS of the data block must be less than this 3.4-volt value for the data block to be eligible for compression. Once a data block becomes compressed, the value is dropped as a recorded value. The role of Delta V-RMS is to create and identify single data blocks. Consequently, compressed data blocks have no meaningful Delta V-RMS value.

The average RMS voltage and its standard deviation and the Delta-VRMS values of the data blocks that follow are compared to the range of permissible values for each variable mentioned above and if all of the values fall within the compression envelope, then the relative volatility of the measured voltage values of the following data block is considered a suitable candidate for compression. The threshold values comprising the voltage compression envelope are defined by the first data block in the compression cycle and never change. This is summarized in Table 2 below:

TABLE 2

Voltage Volatility Compression Envelope Example

| Voltage Variables from data block | Measured Value of $1^{st}$ data block | Permissible range of values for data block compression. Based upon the initial 1.4% Std. Dev. derived for the V-RMS over the 12-cycle data block period. |
| --- | --- | --- |
| V-RMS Std. Dev. | 1.4% | 1.38% -to- 1.42% |
| Avg. V-RMS | 121.3 Volts | 119.6 Volts -to- 123.0 Volts, (3.4-Volt RMS Envelope) |
| Delta V-RMS | 2.8 Volts | Must be less than 3.4 Volts for compression to be allowed. |

Current Volatility:

The volatility of the current is defined as the average measured deviation of the RMS current over a 10/12-cycle period of time.

The concept of current volatility is the same as is the concept of voltage volatility explained above. The standard of deviation measurement of the RMS current is the fundamental measure of volatility for the current variables of that particular data block. As in the case of voltage volatility, current volatility is applied in percent value to the standard deviation measure itself, as well as to the average RMS current, the Delta-IRMS and the power factor values of the data block in question. This creates an envelope of high and low threshold values for determining whether the data blocks that follow are suitable for compression. And like the voltage compression envelope discussed above, the threshold values comprising the current compression envelope are defined by the first data block in the compression cycle, and never change.

The standard of deviation, the average RMS current, the Delta-IRMS and the power factor values of the data blocks that follow are compared to the range of permissible values for each variable mentioned above and if all of the values fall within the compression envelope, then the relative volatility of the measured current values of the following data block is considered a suitable candidate for compression. Table 3 is a table of current values as an example:

TABLE 3 current Volatility Compression Envelope Example

| Current Variables from data block | Measured Value of $1^{st}$ data block | Permissible range of values for data block compression. Based upon the initial 1.5% std. dev. derived for the I-RMS over the 12-cycle data block period. |
| --- | --- | --- |
| I-RMS Std. Dev. | 1.5% | 1.48% -to- 1.52% |
| Delta I-RMS | 0.45 Amps | 0.44 Amps -to- 0.46 Amps |
| Avg. I-RMS | 12.4 Amps | 12.21 Amps -to- 12.59 Amps |
| Power factor | 82% | 80.77% -to- 83.23% |

Once it has been determined that a new data block is suitable for compression, the associated voltage and current values of the new data block are combined with their respective values in the initiating data block to produce an average value for each of the data block's voltage and current elements described above. The data block has now become a compressed data block, whose electrical values, with a couple of exceptions, have been averaged over time. The exceptions are the elapsed time value, the electrical energy measurement in joules or watt seconds, and the maximum minimum peak voltage and peak current values. The elapsed time and the electrical energy measurement values are accumulative over time and are thus summed together. The maximum and minimum peak voltage and peak current values of the new data block are compared with the compression data block, and if the maximum and/or minimum peak values are exceeded by the new data block those values are then updated to reflect the newer greater and/or lesser values in the compression data block.

Thus, the relative volatility of a data block is defined by these two fundamental measures: the standard deviation of the measured RMS voltage and the RMS current values for that 10/12-cycle period. For data block compression to commence, the associated values for the voltage and current variables for the data blocks that follow must fall within the voltage and current compression envelopes as explained above. Once one or more of the voltage or current variables fall outside of the compression envelope, the compression cycle ends and a new period of measured volatility is defined and begun.

The dynamics of data block compression produces two basic kinds of data blocks. It produces data blocks that have undergone a compression cycle and those that have not. Data blocks that fail to compresses indicate that one or more of the electrical values being measured have experienced a transient condition, which caused the measured values to fall outside the acceptable compression limits set by the data block preceding it or of the data block following it.

These uncompressed data blocks stand alone, apart from the rest, indicators of a transient condition of one kind or another. This process produces a filtering effect; automatically segregating volatile data blocks whose values are in relative flux, from the rest of the data blocks, whose values were stable enough to undergo compression.

This effect facilitates the automation of the analysis method by indicating which blocks of time contain these uncompressed or single data blocks. The CPU simply scans the 18,000 200-millisecond blocks of time created every hour, searching for those blocks of time that has single data blocks. Single data blocks produced by different PQ-Nodes on the network and created during the same block of time are related, and share a common data set, which can be determined by simple masking techniques of the variables involved. This method provides an efficient way to automate the analysis method.

Additional Compression Limits

While the fundamental compression limit for a data block is the standard deviation limit explained above, additional limits are introduced below to further enhance and refine the focus of the masking techniques by defining what kind of single data block it is. That is to say, did the data block fail compression because of low voltage dips or high voltage transients, or high current volatility, or some combination of multiple factors? Below are described some additional limits that have been imposed to further constrain data block compression.

Max Peak Voltage limit: this limit is set at 10-15% above the nominal peak voltage. An RMS 120 volt nominal voltage has a peak value of 170 volts. A 10% increase would represent a limit set at 187 volts. Any peak voltage exceeding this amount would inhibit this data block from compressing. This limit is intended for transient capture. Many transients are of such short duration that they may not appreciably impact the standard deviation limits set by the data block. This limit insures that the event is captured so that high voltage transient analysis may be performed. This data block would be flagged and include additional values, representing the transient's peak voltage and the duration of the event, in microseconds, that exceeded the prescribed limit. This data is produced at the initial 153.6 kHz sample rate.

Min Peak Voltage limit: this limit is set at 10-15% below the nominal peak voltage. An RMS 120 volt nominal voltage has a peak value of 170 volts. A 10% decrease would represent a limit set at 153 volts. Any peak voltage falling below this amount would inhibit this data block from compressing. This limit is intended for low voltage transient capture. Many transients are of such short duration that they may not appreciably impact the standard deviation limits set by the data block. This limit insures that the event is captured so that low voltage transient analysis may be performed. This data block would also be flagged and include additional values, representing the transient's voltage dip and the duration of the event, in microseconds, that fell below the prescribed limit. This data is produced at the initial 153.6 kHz sample rate.

Max RMS Voltage limit: this limit is the $3^{rd}$ order of standard deviation set by the data block. Any RMS voltage value for a single ½ waveform that exceeds the $3^{rd}$ order standard deviation value for that data block would prevent it from being compressed. This would indicate an anomalous high voltage condition has occurred that demands further analysis.

Min RMS Voltage limit: this limit is the $3^{rd}$ order of standard deviation set by the data block. Any RMS voltage value for a single ½ waveform that falls below the $3^{rd}$ order standard deviation value for that data block would prevent it from being compressed. This would indicate an anomalous low voltage condition has occurred that demands further analysis.

Voltage and Current Blocks Created During a Compression Cycle:

When a data block compression cycle begins, as explained above, the output of any particular PQ-Node changes. Instead of transmitting data blocks, the node periodically transmits voltage blocks and current blocks. The purpose of these blocks of data is to supply the database in the multi-channel recorder with waveform data for the purposes of waveform reconstruction and Fourier analysis. A brief description of each is given below:

Voltage Blocks: voltage blocks are blocks of data containing strings of concurrently sampled voltage values. Each voltage block contains 10/12 voltage cycles or waveforms, each waveform containing 256 sampled values, for a total of 2560/3072 sampled values per voltage block. Each compression cycle causes at least one voltage block of 2560/3072 sampled values to be sent to the multi-channel recorder as representative of the voltage waveform undergoing the present compression cycle. The number of voltage blocks sent for each compressed data block will depend upon the compression length of the data block. These values are sent to the database in the multi-channel recorder for further processing and Fourier analysis. The Fourier analysis transforms the voltage signature into the frequency domain where harmonic analysis and Total Harmonic Distortion of the voltage signature can be determined.

Current blocks: current blocks are blocks of data containing strings of concurrently sampled current values. Each current block will contain 10/12 current cycles or waveforms, each waveform containing 256 sampled values, for a total of 2560/3072 sampled values per current block. Each compression cycle will cause from one to as many as five current blocks of 2560/3072 sampled values each to be sent to the multi-channel recorder as representative of the current waveform undergoing the compression cycle. These values are sent to the database in the multi-channel recorder for further processing and Fourier analysis. The Fourier analysis transforms the current signature into the frequency domain where conventional current signature analysis can be performed. The five sequential current blocks provide enough data points for the desired frequency resolution required for load analysis.

Communication and Transmission of Data

Every PQ-Node has its own distinct dedicated 1-second window of transmission time per minute, the initial handshaking that occurs between the PQ-Node and the multi-channel recorder prior to the transmission of data blocks is used to determine the accuracy of the internal clocks of the PQ-Nodes with respect to the master clock in the multi-channel recorder. It is also initiated at a very specific programmed standardized time, in microseconds, at the beginning of each 1-second window of transmission for all PQ-Nodes. The difference between when the multi-channel recorder received its initial query from the PQ-Node and when the MCR expected to receive the query (as measured by its own internal clock) is a measure of that PQ-Node's time clock error plus that particular PQ-Node's signal propagation delay.

The propagation delay is determined by the multi-channel recorder during the initiation and start-up of the PQ-Node when it is first installed on the network. This is accomplished by the multi-channel recorder by transmitting an instruction routine to the PQ-Node that takes exactly 100-microseconds to complete. This routine entails transmitting a simple receive and transmit instruction to the PQ-Node, of known duration given the processor speed, plus a defined delay that totals 100-microseconds exactly. The total time measured between the transmission of the instruction by the multi-channel recorder to the PQ-Node and the subsequent reception of the PQ-Nodes response to the multi-channel recorder minus this 100-microsecond period indicates the total propagation delay between the multi-channel recorder and that PQ-Node. This measured delay, divided by 2 represents the propagation delay between the multi-channel recorder and that particular PQ-Node.

Once the time clock error is calculated by multi-channel recorder it then sends a time clock adjustment instruction containing the error adjustment in microseconds to the PQ-Node and has it adjust its internal clock by the amount of this measured error. The timing error is automatically adjusted at least once every hour, which should keep the PQ-Nodes internal time clock consistent and reliably synched to the multi-channel recorder. (This is based upon transmission rates greater than 10 megabits/sec. (See, e.g., the IEEE 1588 Precision Time Protocol).

Because data blocks are sent from the PQ-Nodes to the multi-channel recorder at least once an hour, the clock drift between the PQ-Nodes on the network and the multi-channel recorder is very small and corrected long before it should become a factor.

Figure 18A:
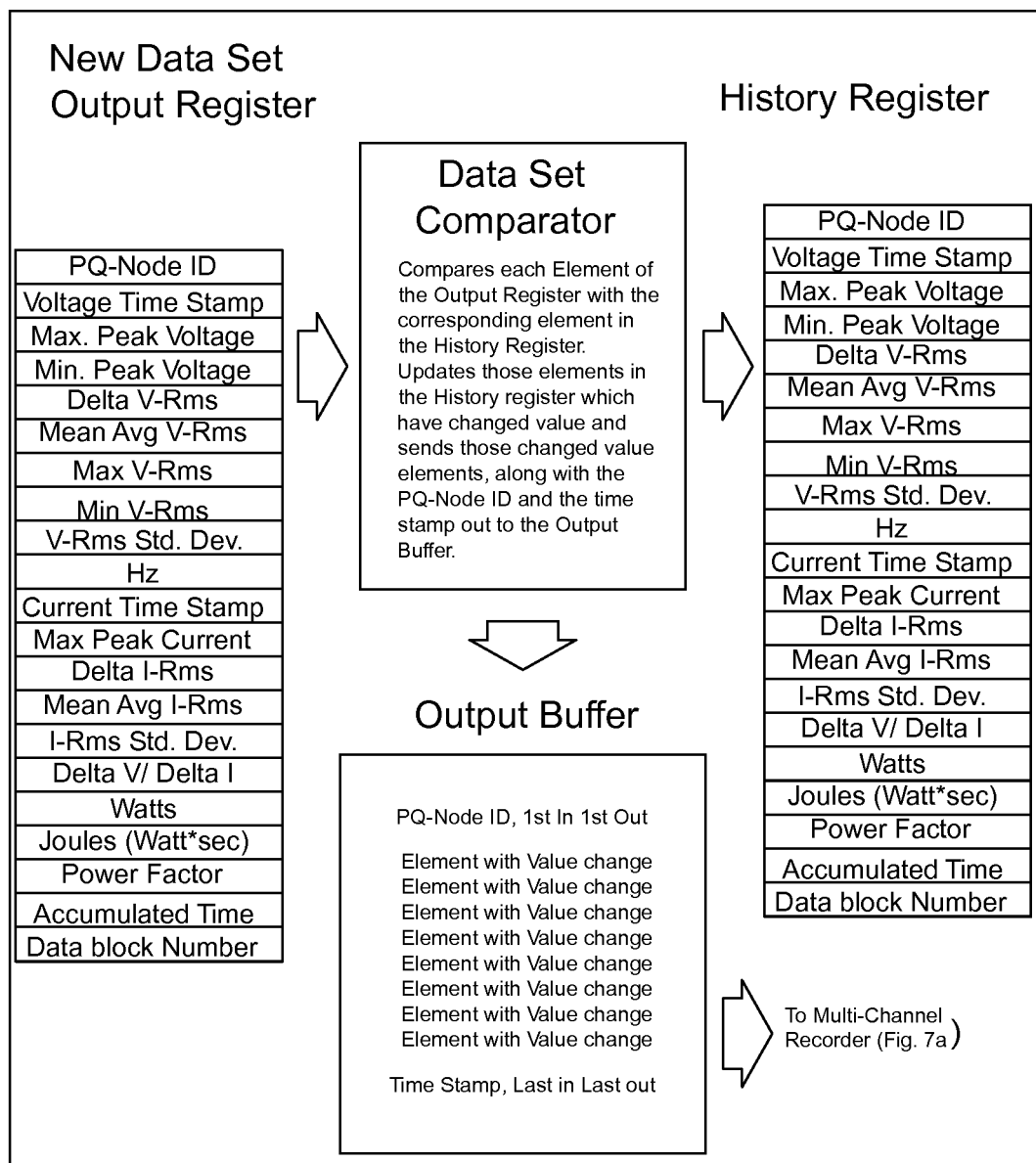
FIG. 18a is graphic and textual explanation the first portion of a PQ-node data block transmission cycle.
Figure 18B:
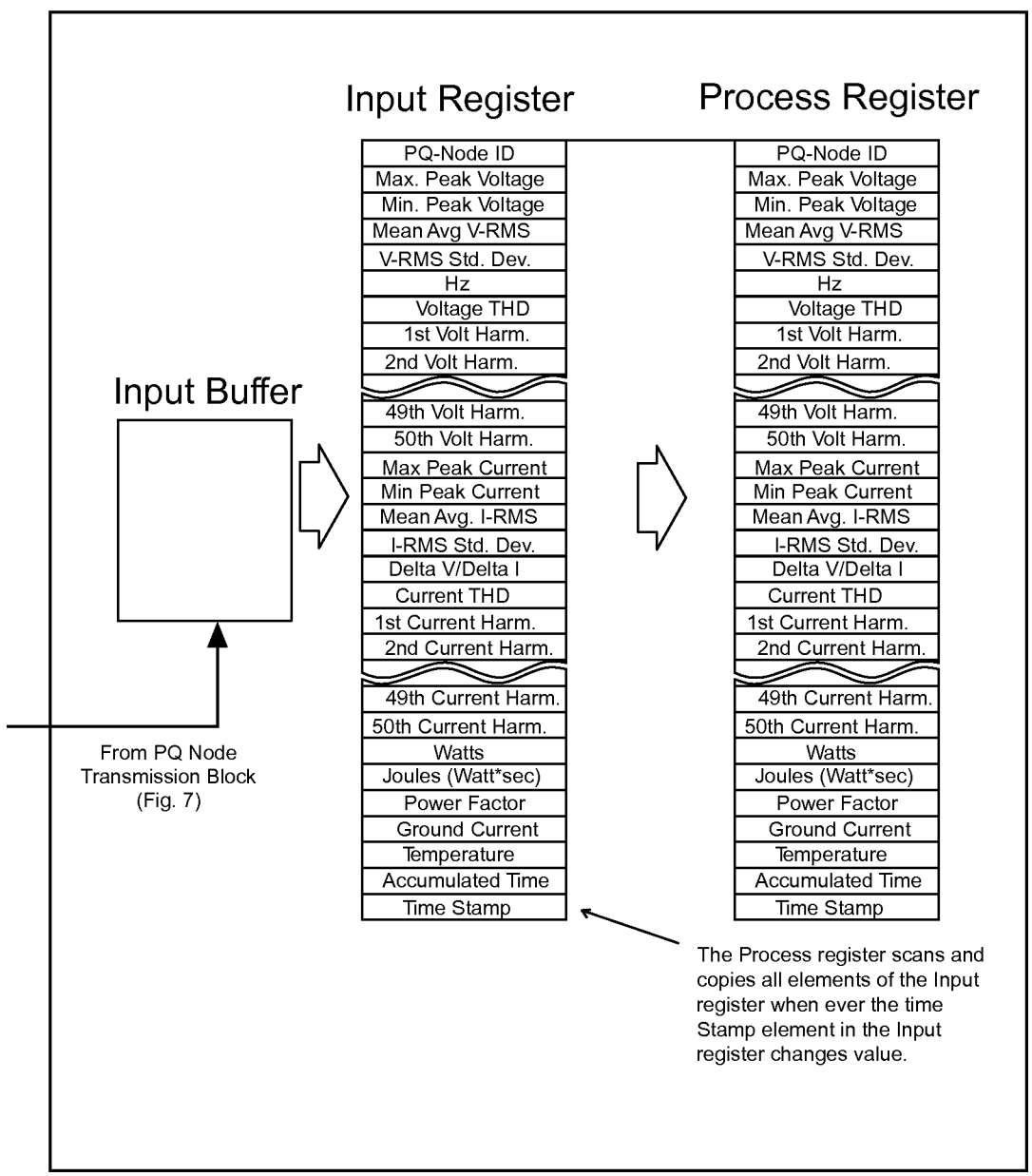
FIG. 18b is graphic explanation the latter portion of a PQ-node data block transmission cycle.
Figure 19:
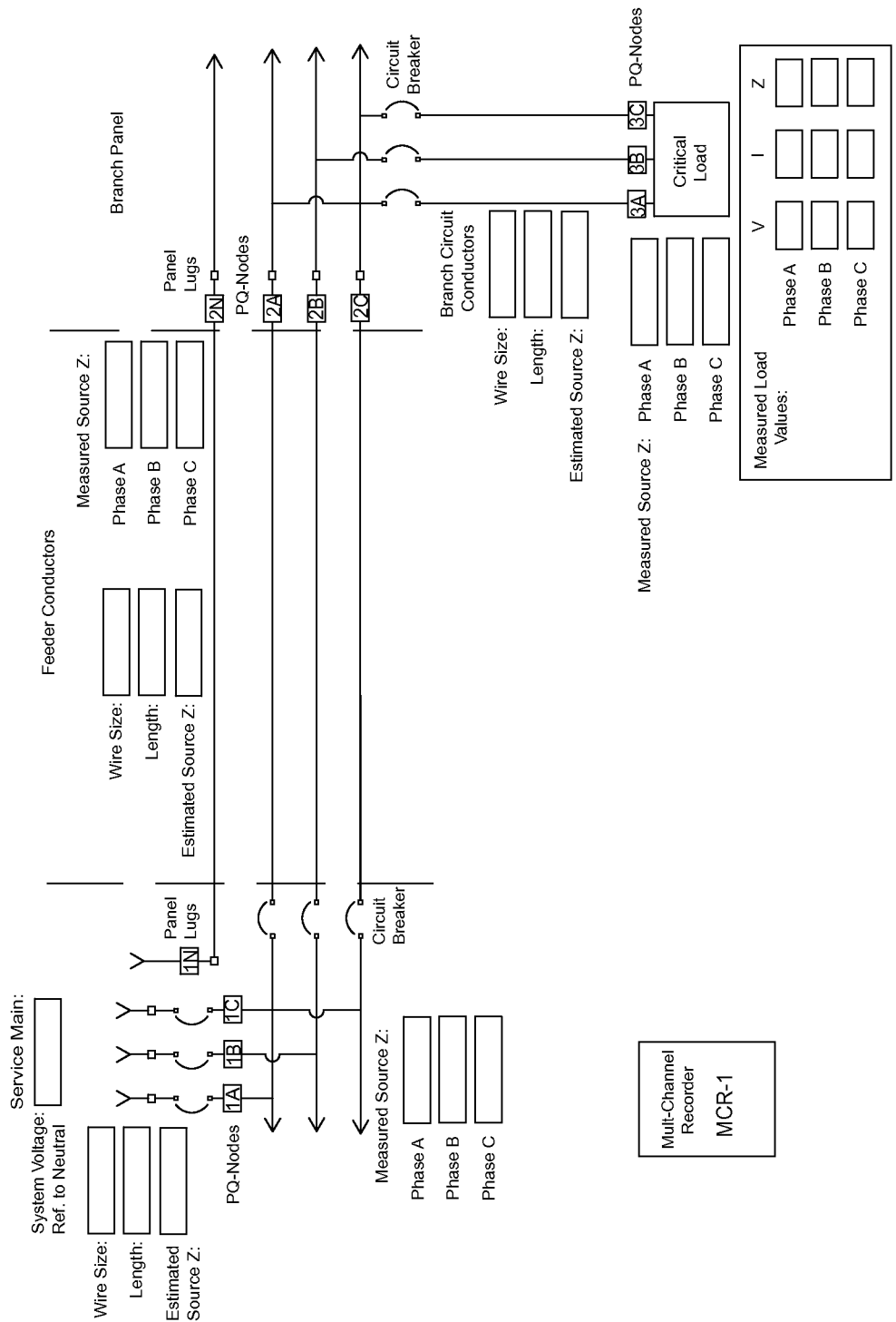
FIG. 19 is an example of the analysis system's software graphical user interface representing the graphical representation of a power distribution circuit.

FIG. 18a is graphic and textual explanation the first portion of a PQ-node data block transmission cycle. FIG. 19 is graphic explanation the latter portion of a PQ-node data block transmission cycle. The input register in the multi-channel recorder is maintained as a copy of the history register in the PQ-Node. Any changes made to the history register are made to the input register. This reduces traffic between the PQ-Nodes and the multi-channel recorder to just those elements whose values have changed since the last transmission.

Dynamic Resistance

Dynamic resistance is a term defined herein as: $\Delta V/\Delta I$

Where $\Delta V$ is defined as: (voltage @ $I_{min}$–voltage @$I_{Imax}$) and $\Delta I$ is defined as: $(I_{max}-I_{min})$ This value is derived from the RMS voltage and current measurements taken over the 12-cycle time period common to all data blocks.

A comparison of the dynamic resistance values taken between the PQ-Node at the service and the PQ-node at the load yields a measure as to how stable the electrical distribution system is in supplying the load. This measure quantifies the electrical energy lost to the wiring between the service and the monitored load being monitored. A sudden change in this measure can indicate weakening mechanical connections in the distribution system.

The impedance, in ohms, of that part of an electrical distribution system supplying a monitored load is calculated by subtracting the dynamic resistance measured at the main service from the dynamic resistance at the monitored load in question. This value reflects the mechanical integrity of all of the distribution components, i.e. the wiring, buss bars, circuit breakers, fuses and mechanical switches, connecting the monitored load to the electrical supply. The measured impedance of the electrical distribution system connecting the monitored load to the electrical supply, multiplied by the square of the monitored load's operating current reveals the amount of power lost to that part of the electrical distribution system connecting the load to the main service.

The voltage drop and the dynamic resistance, when taken together and compared over time, are the best measures of the overall health of the electrical distribution system as a whole. The voltage drop at a monitored load can be studied over a specific time period. From this, the average voltage drop and the standard deviation for the samples of voltage drop measured for that time period can be derived. These values can then be compared, phase-to-phase, for each load.

Moreover, one can average the voltage drop for all of the monitored loads in that time period and derive the standard deviation. These can then be compared to the individual voltage drops measured for each load to the average of the total load to determine worst case in that time period. These can then be trended over time.

Compare the dynamic resistance at a monitored load for the same specific time period as above for the voltage drop. Derive the average resistance and the standard deviation for the measured resistance samples for that time period. Compare these values phase to phase for each load. Average the dynamic resistance for all of the monitored loads and derive the standard deviation. Compare the individual resistances of each load to the average of the total load to determine worst case. Those loads that fell outside the standard deviation are a top priority. These values can be trended over time; comparing each new measured dynamic resistance measurement to the historical trend and to the standard deviation, both individually and collectively.

Electrical Distribution Source Impedance Alarm Threshold:

The standard used in the design of electrical distribution systems is NFPA 70, *The National Electric Code*. It states that for an electrical distribution system designed to provide reasonable efficiency, branch circuit conductors should be sized to prevent a voltage drop of 3% at the furthest outlet of power; and the voltage drop in both feeders and branch circuits to the furthest outlet does not exceed 5%. (A branch circuit supplying a monitored load is usually dedicated to that particular load and by definition is that part of the electrical distribution system between the last over current protective device and the load served.)

According to the above rule, for every 1000 watts of load that a branch circuit supplies electrical power to, not more than 30 watts should be expended in line losses conveying that electrical power to the load and not more than 50 watts total between feeders and branch circuits. This standard provides an industry accepted performance guide to use in comparative analysis of the calculated ideal source impedance, the branch circuit impedance and the measured impedances recorded and trended over time. Thus, an alarm threshold for the monitoring of an electrical distribution system in this case (i.e., that of FIG. 1) is any impedance value causing a 3% or more voltage drop in the branch circuit or a 5% accumulative voltage drop in the electrical distribution system supplying any monitored load monitored by this system of distributed power quality monitors. An alarm threshold is differentiated from a warning threshold, which is more sensitive and is designed to produce warnings of probable alarms should existing trends continue to deteriorate.

The alarm threshold provides an initial performance test of an existing circuit. The initiation and startup of the PQ-Nodes for a monitored load is performed by programming of the GUI discussed below. The ideal impedance values calculated indicate if the existing branch circuit and subsequent electrical distribution system are adequate to supply the amount of power required by the addition of the critical load.

Electrical Distribution Source Impedance Warning Threshold:

Once the monitored load and its PQ-Nodes have been installed on the facility's electrical distribution system, the source impedance and voltage drop data collected by the PQ-Nodes and sent to the multi-channel recorder for analysis begin. Initial source impedance values are recorded and use for comparison of values sampled over time. A relative increase in source impedance of 10% compared to the initial value recorded for that PQ-Node elicits a source impedance warning, including an estimate of the additional power lost to the distribution system. This warning identifies the location in the electrical distribution system where additional electrical maintenance should be employed and records the accumulation of the additional energy that the weakening distribution system is responsible for until the maintenance is performed and the source impedance values are brought down to less than 10%. The actual cost of the additional electrical energy wasted in the electrical distribution system is quantified using the facility's utility rate schedule. Further warnings can be added as follow ups to the initial warning, based upon either response time to the warning and or the accumulated waste of energy reaching a certain user defined predetermined amount.

Weekly, monthly, quarterly and yearly reports detailing the amount of energy lost to the facility's electrical distribution system can also be generated. The report details the ideal minimum amount of energy expended, and how much was actually expended. The difference in these values indicates the amount of wasted energy borne by the facility in the performance of its business. The cost to the business by the energy wasted in the facility's electrical distribution system is quantified by using the facility's utility rate schedule, as well as illustrating where in the facility's electrical distribution system the greatest waste exists.

Analysis Techniques Provided by Data Block Compression:

Z-blocks: A Z-block is defined as a single data block in which the Delta-I exceeds the compression limits of the preceding data block and the data block which follows it. This is the most common single data block, and is created during periods of load shifting, when the current measured in the circuit is either increasing or decreasing. It is referred to here as a Z-block because it is at these times when the dynamic or source impedance is measured.

The source impedance is defined as: Delta V-RMS/Delta I-RMS. The Delta V-RMS is defined as the difference in voltage between the last cycle recorded in the data block and the first cycle recorded in the data block and the Delta I-RMS is defined as the difference in current between the last cycle recorded in the data block and the first cycle recorded in the data block. The ratio of Delta-V-RMS/Delta-I-RMS reveals how stiff the source voltage and electrical distribution system is in response to fluctuations in current demand.

The source impedance is measured at each monitored load every time the load changes states, from off to on and from on to off or when the load shifts from one current level to another. The change in voltage divided by the change in current as seen by the load during these load shifts reveals the impedance of the electrical distribution system supplying that load. This value would be averaged over time and a standard deviation measure derived for it as well.

The analysis of Z-blocks is further expanded upon in the Circuit Analysis Section below. The other single data blocks, in contrast, are indicative of transient or anomalous events that often portend serious conditions arising in the electrical distribution system. These blocks are described below:

High Peak Voltage data block: this single data block is created when the peak voltage limits, as explained above, have been exceeded. The purpose of this data block is to indicate the peak value of the high voltage transient, the duration of the transient and the time that it occurred. The use of this single data block in transient analysis is explained below in the Transient Analysis portion of the outline.

High Max RMS Voltage data block: this single data block is created when the max RMS voltage limit, has been exceeded. The purpose of this data block is to indicate that a high RMS voltage event has occurred. This single data block is used primarily in transient analysis and is explained below in the transient analysis portion below.

Min Peak Voltage data block: this single data block is created when the min peak voltage limits, as explained above, have been exceeded. The purpose of this data block is to indicate the minimum value of the low voltage transient, the duration of the transient and the time that it occurred. This single data block is used for both transient analysis and electrical distribution analysis is explained below in the transient analysis and the electrical distribution analysis portion below.

Low RMS voltage data block: this single data block is created when the min RMS voltage limit, as explained above, has been exceeded. The purpose of this data block is to indicate that a low RMS voltage event has occurred. This single data block is used primarily in electrical distribution analysis, which is explained below in the electrical distribution analysis portion below.

Transient Analysis Section:

As introduced earlier, transient voltage is probably the most destructive, costly and common power quality issue today. Voltage transients cost companies and homeowners billions of dollars every year in equipment damage, system downtime and lost production. Most people are familiar with the large external transients and the immediate damage they can cause. This is because these large events are usually instantaneous and the damage is visual. However, what many people overlook is the serious damage the less noticeable and less intense internal transients are causing day after day. Internally generated transients are responsible for 80% of electrical and electronic equipment damage. These surges are the result of normal everyday equipment operations. Common culprits include; drives, motors, copiers, microwaves, printers, welders and lights. Many of these loads would be monitored by the disclosed predictive fault analysis system.

It seems a natural progression then, that a predictive fault analysis system employing the use of permanently installed distributed power-monitoring sensors, would include the integration of transient voltage surge suppression into the design of the distributed power sensors. This would have the beneficial effect of providing transient voltage surge protection for any load monitored by the system as well as at the electrical distribution panels where the power monitors would also be installed. This would greatly reduce the damaging effects that transient voltages pose to a facility's electrical distributions system and to the electrical loads supplied.

As transient analysis is one of the forms of analysis that is provided by the disclosed predictive fault analysis system, a brief discussion of the term transient, as it is used here, is warranted.

To explain, a "Transient" as introduced above, is the term for a disturbance that lasts less than one cycle. The IEEE Std. 1159-1995, *Recommended Practice for Monitoring Electric Power Quality*, is the standard that is used here for the definition and classification of transients. Transients are either impulsive or oscillatory in nature. An impulsive transient is normally a single, very high impulse. Lightning is the most common cause of impulsive transients.

An oscillatory transient oscillates at the natural system frequency and normally dies down within a cycle. These transients (sometimes called switching transients) occur when you turn off an inductive or capacitive load, such as a motor or capacitor bank. An oscillatory transient results because the load resists the change. This is similar to what happens when you suddenly turn off a rapidly flowing faucet and hear a hammering noise in the pipes. The flowing water resists the change, and the fluid equivalent of an oscillatory transient occurs.

TABLE 4

Summary of Types of Transient Conditions

| Transient Categories | Spectral Component | Duration |
|---|---|---|
| Impulsive | | |
| Millisecond (low frequency) | 0.1 msec rise | >1 msec |
| Microsecond (medium frequency) | 1 μsec rise | 50 nsec to 1 nsec |
| Nanosecond (high frequency) | 5 nsec rise | <50 nsec |

TABLE 4-continued

Summary of Types of Transient Conditions

| Transient Categories | Spectral Component | Duration |
|---|---|---|
| Oscillatory | | |
| Low frequency | <5 kHz | 0.3 msec to 50 msec |
| Medium frequency | 5 kHz to 500 kHz | 5 μsec to 20 μsec |
| High frequency | 0.5 MHz to 5 MHz | 5 μsec |

Rise time and duration characterize impulsive transients, while frequency and duration characterize oscillatory transients. Both impulsive and oscillatory transients are subdivided into three categories related to the frequencies. Low-frequency transients are the types most likely to occur in a power system. Medium-frequency transients aren't as common, but they have much higher amplitudes. One generally observes high-frequency transients only near the source of the disturbance, and the response characteristics of the instrument transformers affect your ability to measure them.

The effect a transient has on a power system depends on the amplitude of the transient and its frequency. In the case of oscillatory transients, the frequency of the transient often causes problems—although the amplitude can cause problems as well. For example, oscillatory transients can wreak havoc with Variable Speed Drives.

In the case of impulsive transients, the amplitude of the transient often causes problems. The damage caused by a transient can be immediate, as is sometimes the case with a lightning strike, or gradual, as in a response to a series of low-amplitude transients. These low-amplitude transients slowly degrade insulation until a short circuit eventually occurs. Instead of immediate damage by one high-amplitude transient, low amplitude transients can occur repetitively thousands of times a day. These surges are damaging and can be as high as 6000 volts! Internal transient damage is rarely noticed because these events are typically not instantaneously damaging nor is the damage visual. The cumulative damage isn't noticed until the system is upset or fails. The installation of a distributed system of PQ-Nodes with integrated transient voltage surge suppression would shed many of these transients to ground, there by isolating the monitored loads from their harmful effects.

From an electrical distribution analysis point of view, the disclosed predictive analysis system uses the PQ-Nodes, distributed throughout the facility's distributions system, to locate the origin and classify the electrical transients recorded. By comparing the measured values of a single transient, recorded by several different PQ-Nodes distributed at different points on the electrical distribution system, the multi-channel recorder can determine the origin of the transient as well as classifying the type of transient condition. The periodic energy reports produced by the disclosed predictive analysis system's software include a detailed account of the number of transients recorded by the distributed PQ-Node monitoring system as well as their origins and classifications. Facility loads that produce harmful transients are identified.

From a load analysis point of view the transient signature created when a monitored load is initially turned on or off can be measured and analyzed it to determine the load's inductive or capacitive reactive component, as seen by the electrical distribution system, which can reveal the symptoms that predict operational failure because fundamental changes in the reactive component of a load's impedance indicate the way that the load converts electrical energy to work has changed; and this usually means a dynamic shift has occurred in the operational parameters that define the monitored load. In this way, studying the transients produced by a monitored load as it changes states provides the disclosed predictive analysis system another measure with which to gage the health of a monitored load.

The disclosed predictive analysis system uses the PQ-Nodes, distributed throughout the facility's distributions system, to locate the origin and classify the electrical transients recorded. By comparing the measured values of high peak voltage high max RMS voltage, and the min peak voltage, a single transient, recorded by several different PQ-Nodes distributed at different points on the electrical distribution system, the multi-channel recorder can determine the origin of the transient as well as classifying the type of transient condition. The classification of the transient is determined with respect to the IEEE Std. 1159-1995, *Recommended Practice for Monitoring Electric Power Quality*, as introduced above or other applicable industry accepted standards. The periodic energy reports produced by the disclosed predictive analysis system's software include a detailed account of the number of transients recorded by the distributed PQ-Node monitoring system as well as their origins and classifications. Facility loads that produce harmful transients are identified.

Electrical Distribution or Circuit Analysis Section:

Dynamic Impedance: as noted above, this is a comparison of the dynamic resistance values taken between the PQ-Node at the service and the PQ-node at the load and yields a measure as to how stable the electrical distribution system is supplying the load. This measure quantifies the electrical energy lost to the wiring between the service and the critical load being monitored. A sudden change in this measure can indicate a weakening mechanical connection in the distribution system.

The impedance of that part of an electrical distribution system supplying a critical load is calculated by measuring the dynamic resistance at the critical load in question, as defined above, and subtracting from this number the dynamic resistance measured at the main service. This reveals the impedance in ohms of the distribution system between the main service and the critical load in question. This value reflects the mechanical integrity of all of the distribution components, i.e. the wiring, buss bars, circuit breakers, fuses and mechanical switches, connecting the critical load to the electrical supply.

The measured impedance of the electrical distribution system connecting the critical load to the electrical supply, multiplied by the square of the critical load's operating current reveals the amount of power lost to that part of the electrical distribution system connecting the load to the main service.

The following section provides a series of examples for how this system can be used. FIG. 19 is a representation of a Graphical User Interface (GUI) system interface for representation of Electrical Distribution System of FIG. 1. The software is located in multi-channel recorder and accessed directly or via system server.

Figure 20:
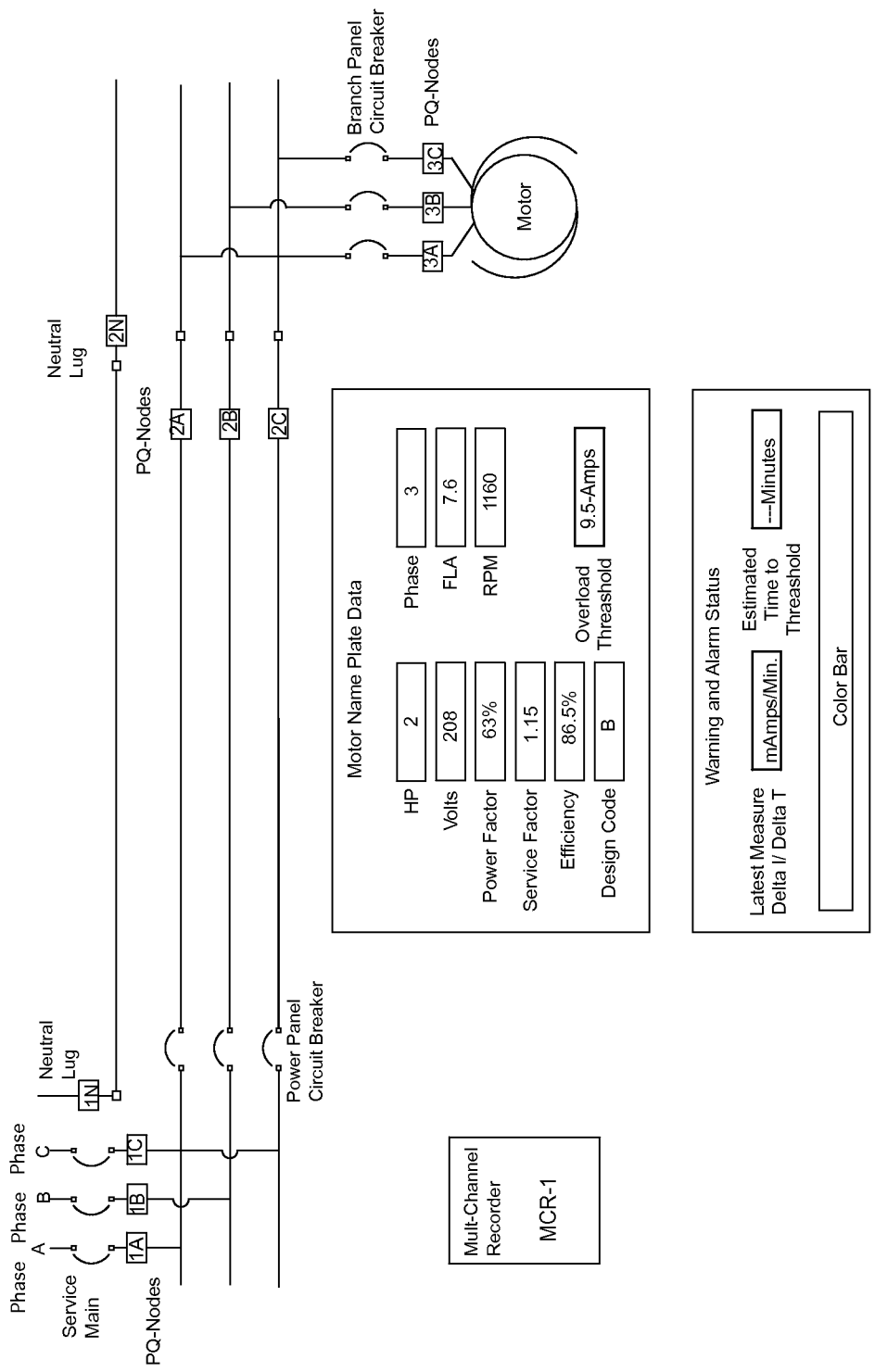
FIG. 20 is an example of the analysis system's software graphical user interface representing the graphical representation of a portion of the circuit of FIG. 19 with the data fields for a monitored load filled in with sample data.

FIG. 20 is a representation of an example of predictive fault analysis system's software of graphical user interface for representation of critical load data. This software is located in multi-channel recorder and accessed directly or via system server.

Analysis Fundamentals:

A facility's maintenance department is generally tasked with the proper upkeep, maintenance and repair of the electrical distribution system, as well as the troubleshooting and repairing the various loads that are integral with the facility's business or reason for being. When troubleshooting electrical problems, determining whether a fault (or a predication of a fault) was caused by the electrical distribution system or the load is the first question asked. For this reason, the analysis method splits the analysis into these two parts, electrical distribution analysis and load analysis.

Analysis of the Electrical Distribution System:

Referring again to FIG. 1, the electrical distribution system of a facility conveys electrical energy from the point where the serving utility delivers it, usually the main service of the facility, to the electrical load. It is composed of wiring, circuit breaker panels, disconnects, transformers and other elements that are mechanically bonded together to form a low resistance path to serve the electrical appliances or loads that converts the electricity to useful work.

As discussed above, the health of an electrical distribution system can be determined by monitoring and measuring the impedance of the branch circuits delivering power to the various loads and recording these values and comparing them over time. A sudden change or increase in the impedance of a particular branch circuit signifies an increase in the energy consumed by the branch circuit in the form of heat. Such heat created in the electrical branch circuit can cause serious problems if not caught in time for it is a major cause of building fires.

Electrical Distribution Analysis Example

As noted above, when a PQ-Node is installed on an electrical distribution system, its relative location with respect to the monitored load and all other PQ-Nodes pertinent to the protection of that critical load is defined in the analysis software via a graphical user interface. See, e.g., FIG. 19. A PQ-Node installed at the monitored load is located at the end of a branch circuit and monitors only the current drawn by that monitored load. A PQ-Node that is located at a breaker panel or feeder monitors current that is drawn by multiple loads and therefore has a different perspective of the electrical distribution system from a comparative analysis point of view than the PQ-Node located at the monitored load. This is an important distinction between these two PQ-Nodes. While the hardware is the same, their relative placement on an electrical distribution system means that the data collected from the two will, in some cases, be compared differently. The comparative differences between the various PQ-Nodes are defined in the software at the multi-channel recorder and are integral to the creation and definition of the various comparative algorithms that constitute the automated analysis method. This difference is defined in software when the symbolic PQ-Nodes are placed onto a graphical user interface representing the electrical distribution system. This is explained below.

The graphical user interface, or GUI, shown in FIG. 19, resembles an electrical power schematic showing the monitored load, the main service and that part of the electrical distribution system connecting the monitored load to the main service. The GUI includes basic electrical distribution symbols that represent the actually physical hardware that constitutes the real electrical distribution system. These electrical distribution symbols can be selected by the installer, via drop down menus from a tool bar that is located at the top of the operator interface screen (not shown). The appropriate symbols are selected, dragged and dropped into place to build a graphical representation of the actual electrical distribution system connecting the monitored load to the electrical supply. The PQ-Node symbols are selected, dragged and dropped unto the GUI's representative electrical distribution system in the same relative place that they are installed physically. Each PQ-Node's ID and the multi-channel recorder's ID that the PQ-Node contacts is identified by typing the ID into a text block that appears in every PQ-Node and multi-channel recorder symbol. The phase and voltage magnitude along with the circuit breakers, electrical switches, wire size and estimated length of the branch circuit or feeder conductors associated with each PQ-Node is similarly identified and inputted into the analysis software.

Each symbol selected in the building of the GUI's representative electrical distribution system has a corresponding programmed temperature adjusted impedance value. These values are derived from manufacture's operating and performance data, National Bureau of Standards Handbook 100, and in-house micro-ohm testing performed during PQ-Node installation and startup. As the symbols are selected and connected together, an estimated impedance value for that part of the electrical distribution system is calculated. The programmed impedance values for the circuit breakers, electrical switches, wire size and estimated length of the branch circuit or feeder conductor information associated with each PQ-Node are summed together to create a total temperature-compensated impedance value for that part of the electrical distribution system monitored by that PQ-Node. This estimated impedance value is adjusted continuously and automatically, based upon the temperature fluctuations recorded at the PQ-Nodes in the data blocks that are sent to the multi-channel recorder. The purpose for temperature compensation of the "ideal" impedance values is to compensate for the effect that fluctuating ambient temperatures have on actual impedance values. If the estimated "ideal" impedance value is to be used as a baseline reference for comparison purposes to actual values measured at the PQ-Nodes, then this it must fluctuate as ambient temperature fluctuates.

The programming for this is done either at the multi-channel recorder for the PQ-Node in question, via a laptop or similar computer peripheral, or at the system server.

Once all the PQ-Nodes related to the protection of a monitored load have been installed on the electrical distribution system, and their relevant information has been inputted into software via the graphical user interface described above, monitoring of the electrical distribution system is begun by the multi-channel recorder. As discussed above, the multi-channel recorder initiates contact with each of the PQ-Nodes that have been identified in the software; it sets the internal time clock of the PQ-Node and establishes its unique transmission cycle. Once initialization is completed by the multi-channel recorder, the PQ-Node begins to measure the voltage and current values in 200-millisecond blocks of time as explained above. The PQ-Nodes transmit the data to the multi-channel recorder at varying rates per hour depending upon the volatility of the data collected, via the data log transmission mode or immediately if requested by the multi-channel recorder via the alarm transmission mode. The multi-channel recorder compares the electrical values from different PQ-Nodes whose relative relationships have been established and defined in the analysis software via the initialization and startup procedure explained above.

As an example, referring to FIG. 20, the dynamic resistances for PQ-Nodes 1A, 2A and 3A are calculated. This calculation is done by measuring the voltage change at the various PQ-Nodes distributed in series along the distribution system in response to the change in the current drawn by the monitored load.

The 200-millisecond data block created at PQ-Node 3A contains the record of a sudden shift in current and subsequent change in voltage as measured at that PQ-Node in the same data block that is poled from PQ-Nodes 1A and 2A by the multi-channel recorder for comparison and analysis purposes. This insures that the sudden current increase and subsequent voltage drop measured at PQ-Node 3A is the same current increase and cause for the relative voltage drops measured at PQ-Nodes 1A and 2A respectively. It is this synching of electrical measurements recorded at the same time and taken at different locations on the electrical distribution system that makes the dynamic resistance measurement a useful tool for the instant analysis method.

This value is used to determine the amount of energy lost to the phase-A portion of the electrical distribution system in the form of heat. As noted above, this is the source impedance, indicated with the letter Z. The source impedance at PQ-Node 3A, located at the monitored load represents the total source impedance, as seen by the load, for the phase-A part of the distribution system. This value is compared to the ideal source impedance value as calculated by the software, explained above. The difference represents the amount of energy wasted by the electrical distribution system and, which can be potentially saved with proper maintenance. This value is recorded and charted over time and is a key addition to a facility's preventative maintenance schedule.

The impedance of the branch circuit supplying the load is equal to the source impedance as measured at PQ-Node 3A minus the source impedance measured at PQ-Node 2A, located at the end of the feeder conductor, in the branch circuit panel, as indicated in FIG. 20. The impedance value for the feeder conductors and its associated hardware is derived by subtracting the source impedance measured at PQ-Node 1A, located at the main service, from the source impedance measured by PQ-Node 2A. The impedance values derived for the branch circuit, feeder and main service for the electrical distribution system supplying the monitored load in question are the fundamental values of concern with regards to assessing the health and reliability of that part of the electrical distribution system. If any part of the electrical distribution supplying the monitored load fails, then the monitored load fails.

These three PQ-Nodes, 1A, 2A and 3A monitor the phase-A portion of the electrical distribution supplying the monitored load. The phase-B and the phase-C portions of the electrical distribution system are monitored by the PQ-Nodes 1B, 2B and 3B and PQ-Nodes 1C, 2C and 3C respectively. An example of using the measured source impedance from the three PQ-Nodes that monitor the monitored load in FIG. 20 and calculating the total power lost to the electrical distribution system supplying the monitored load is explained in table 3 below. The multi-channel recorder polls the relevant data, as displayed in table 4 below, from the same data block produced by each of the PQ-Nodes 3A, 3B and 3C. It squares the change in current, (Delta I), multiplies it by the impedance, (Delta Z), and the power factor measured for each PQ-Node to produce the wattage for that phase of the distribution system that the PQ-Node monitors. The multi-channel recorder then sums the wattages from each of the PQ-Nodes to reveal the total power lost to the electrical distribution system with respect to the operation of the monitored load.

TABLE 5

Using Source Impedance to Calculate Power lost to Distribution System

|  | Delta I | Delta V | Delta Z | Power factor | Power loss in Wiring |
|---|---|---|---|---|---|
| PQ-Node 3A | 20.79 Amps | 2.89 Volts | 0.1390 Ohms | 0.87 | 52.27 watts |
| PQ-Node 3B | 20.90 Amps | 2.95 Volts | 0.1411 Ohms | 0.87 | 53.64 watts |
| PQ-Node 3C | 20.86 Amps | 2.92 Volts | 0.1400 Ohms | 0.87 | 52.97 watts |
| Avg. Value | 20.85 Amps | 2.92 Volts | 0.1400 Ohms | 0.87 | 52.97 watts |

Total Power lost to Electrical Distribution for this load: 158.9 watts

Because the length and makeup of the different phase conductors for the branch circuit and the feeder conductors supplying the monitored load are nearly identical, it follows that the voltage dropped and the subsequent impedance measured for them should be the same. Thus, the impedance measured at PQ-Nodes 3A, 3B and 3C, for the branch circuit conductors, should be the same and the impedance values measured at PQ-Node 2A, 2B and 2C, for the feeder conductors, should as well be the same.

If the associated wire lengths of the three phase conductors for the branch circuit conductors and for the feeder conductors are the same, then the deviation or difference in impedance values measured between the phases is most likely caused by a loosening mechanical connection. Detecting a loosening or deteriorating mechanical connection is the fundamental purpose and aim of the electrical distribution analysis method here.

A loosening or deteriorating mechanical connection can evolve into a series arcing fault, which is a partial or total failure in one of the conductive paths in series with the load. This failure is characterized by a completely opened conductor path (which is indicated by an infinite resistance) or by resistance alternating between infinite to high resistance and back again. It can take the form of an intermittent connection, such as loose wire terminals, poor splices, or poor contacts. All of these are classed as high resistance faults. It can take the form of a glowing contact is a kind of series arcing fault that is the result of abnormally high resistance in the wiring or terminal connection resulting in the reduction of current flow and the excessive heat at the fault. This high resistance fault can become extremely hot with temperatures exceeding 600 degrees Fahrenheit. Obviously, detecting this kind of fault is of great importance since it can lead to the ignition of building materials and is responsible for many electrical fires every year. These kinds of high resistance faults become catastrophic over time because they are allowed to. Most of them are hidden and go unnoticed until they become catastrophic. Thus, detection of these high resistance faults and the subsequent production of a report warning a facility's maintenance department as to the nature and location of the fault is the fundamental aim of this part of the automated analysis system.

By continuous monitoring of impedance values and voltage drops measured by the various PQ-Nodes distributed throughout the electrical system, and comparing these values to the historical trends that have been developed over time, any deviation from the norm is identified early on. These faults are noticed almost immediately, as their telltale high resistance condition stands out against the backdrop of the ideal impedance baseline created when the PQ-Nodes were first initiated and the historical trends that have been developed over time. Locating the fault is as simple as identifying the PQ-Node that produced the data block with the high impedance values.

The use of standard deviation as a measure of the volatility of the current and the voltage described above is employed here as well in the monitoring for intermittent high resistive faults as described above. As an example, the voltage difference between PQ-Node 3A and PQ-Node 2A in FIG. 13 is the voltage drop between the two and is directly proportional to the branch circuit impedance in the wiring connecting the two. An erratic, intermittent voltage drop is indicative of erratic and intermittent branch circuit impedance. If a comparison of the standard deviation for the voltages recorded at both PQ-Nodes revealed a higher standard deviation for the voltage at PQ-Node 3A than at PQ-Node 2A, then the erratic voltage drop between the two PQ-Nodes in question is most likely caused by an intermittent high resistance fault located in the wiring connecting the two. Troubleshooting and determining the cause of an intermittent fault condition can be one of the toughest parts system analyses. The use of standard deviation in the quantification of voltage volatility and comparing this measure to various points along the electrical distribution system in this case provides an early warning of an intermittent high resistance fault condition.

The present disclosure should not be construed in any limited sense other than that limited by the scope of the claims having regard to the teachings herein and the prior art being apparent with the preferred form of the invention disclosed herein and which reveals details of structure of a preferred form necessary for a better understanding of the invention and may be subject to change by skilled persons within the scope of the invention without departing from the concept thereof.

What is claimed is:

1. A method of collecting data for fault predicting for an electrical system having a source line, branch circuits, and loads comprising the steps of:
 a) installing a plurality of power quality nodes, said plurality of power quality nodes being disbursed about said electrical system on said source line, said branch circuits and said load, each of said power quality nodes configured for sensing voltage and current, a microprocessor, a non-volatile memory, an alarm transmitter/receiver and a data logger transmitter/receiver;
 b) installing at least one multi-channel recorder, in wireless communication with each of said plurality of power quality nodes;
 c) installing at least one network server in communication with said multi-channel recorder;
 d) installing a base computer station in operative communication with said multi-channel recorder and said network server;
 e) assembling a plurality of data blocks stored on said each of said power quality nodes, wherein each of said plurality of data blocks contains a plurality of recorded parameters;
 f) further wherein each of said plurality of data blocks has a time frame of 200 ms; and further wherein said data blocks are accumulated continuously such that within each hour 18,000 data blocks are created for each power quality node; and
 wherein the plurality of recorded parameters includes:
  a) a power quality node ID;
  b) Maximum Peak voltage;
  c) Minimum Peak voltage;
  d) Maximum Peak voltage of the data block;

e) Minimum Peak voltage of the data block;
f) Average Root Mean Squared (RMS) voltage;
g) Maximum Peak current;
h) Minimum Peak current;
i) Average RMS current;
j) Standard deviation of the RMS current; and
k) a factor Delta V/Delta I.

2. The method of claim 1 wherein the plurality of recorded parameters further includes:
a) watts;
b) joules;
c) power factor; and
d) an accumulated time stamp.

3. The method of claim 1 further comprising a step of creating a database of normal conditions such that each of the recorded parameters within said plurality of data blocks is compared to said database of normal conditions to determine whether said parameter is within said database of normal conditions.

4. The method of claim 3 wherein the step of creating a database of normal conditions further includes the step of calculating a standard deviation for each of said parameters.

5. The method of claim 4 further comprising the steps of:
a) determining whether the parameters in a single data block are within the database of normal conditions;
b) if said parameters are within said database of normal conditions, compressing said data block with other data blocks being within said database of normal conditions; and
c) if at least one of said parameters are outside said database of normal conditions, then retaining said data block as a single data block.

6. The method of claim 1 wherein each of said data blocks in a power quality node has a time stamp, and further wherein said time stamp of said power quality node is calibrated to the time stamps of all other power quality nodes within said plurality of power quality nodes.

7. The method of claim 1 wherein said base station is configured for analyzing said plurality of data blocks.

8. The method of claim 7 wherein analyzing said plurality of data blocks a means for trend analysis.

9. The method of claim 7 wherein analyzing said plurality of data blocks a means for transient analysis.

10. The method of claim 7 wherein the base station is configured for alerting a maintenance department of a needed repair on said electrical system.

11. The method of claim 1 wherein said multi-channel recorder is configured for analyzing said plurality of data blocks.

12. The method of claim 11 further including the step of performing a Fourier analysis on voltage and current readings stored in said plurality of data blocks.

13. The method of claim 11 wherein analyzing said plurality of data blocks includes a warning level for each of said parameters within said data block.

14. The method of claim 11 wherein analyzing said plurality of data blocks includes an alarm level for each of said parameters within said data block.

15. The method of claim 11 further comprising the step of creating a load profile for said electrical system.

16. A method for collecting data used in predicting faults in an electrical system, the method comprising:
generating a plurality of samples sets, each sample set generated by one of a plurality of power quality nodes sampling a voltage and a current of a conductor of the electrical system during one of a series of time blocks, the voltage comprising a series of voltage cycles and the current comprising a series of current cycles, the samples made by one of the plurality of power quality nodes, the power quality node coupled to the conductor;
each of the plurality of power quality nodes generating a series of electrical value sets, each electrical value set based on one of the sample sets;
each of the plurality of power quality nodes storing, for each of the power quality nodes, a series of data blocks wherein each of the data blocks contains a data block value set based on one or more of the electrical value sets;
each of the plurality of power quality nodes generating a set of compression criteria for each data block based on the data block value set for that data block; and
each of the plurality of power quality nodes generating the series of data blocks by compressing the electrical value set of a present time block of the series of time blocks into a data block value set of a preceding data block of the series of data blocks if the electrical value set of the present time block meets one or more compression criteria of the set of compression criteria of the preceding data block, else creating a new data block of the series of data blocks with the electrical value set of the present time block as a data block value set of the new data block.

17. The method of claim 16,
wherein the data block value set of the preceding data block is based an electrical value set for a preceding time block, the preceding time block one of the series of time blocks preceding the present time block.

18. The method of claim 16,
wherein the time blocks are 200 milliseconds in duration.

19. The method of claim 16,
wherein the time blocks are of equal duration in a multiple of 200 milliseconds.

20. The method of claim 16, wherein each electrical value set includes one or more of:
a time block maximum peak voltage;
a time block minimum peak voltage;
a time block average RMS voltage;
a time block RMS voltage standard deviation;
a time block maximum RMS voltage;
a time block delta RMS voltage;
a time block maximum peak current;
a time block minimum peak current;
a time block average RMS current;
a time block RMS current standard deviation;
a time block maximum RMS current;
a time block delta RMS current;
a time block power factor; and
a time block source impedance.

21. The method of claim 20,
wherein each voltage cycle comprises two voltage half cycles;
wherein each current cycle comprises two current half cycles;
wherein the time block maximum peak voltage is a maximum peak voltage of the conductor during the time block;
wherein the time block minimum peak voltage is a minimum peak voltage of the conductor during the time block;
wherein the time block average RMS voltage is an average of an RMS (Root Mean Squared) voltage of each of the voltage half cycles of the conductor over the time block;

wherein the time block RMS voltage standard deviation is a standard deviation of an RMS voltage of each of the voltage half cycles of the conductor during the time block;

wherein the time block maximum RMS voltage is a maximum RMS voltage of any half voltage cycle of the conductor during the time block;

wherein the time block delta RMS voltage is a value that is a difference between an RMS voltage of a last voltage cycle of the conductor in the time block and an RMS voltage of first voltage cycle of the conductor in the time block;

wherein the time block maximum peak current is a maximum peak current of the conductor during the time block;

wherein the time block minimum peak current is a minimum peak current of the conductor during the time block;

wherein the time block average RMS current is an average of an RMS current of each of the current half cycles of the conductor during the time block;

wherein the time block RMS current standard deviation is a standard deviation of the RMS current of each of the current half cycles of the conductor during the time block;

wherein the time block maximum RMS current is a maximum RMS current of any half cycle of the conductor during the time block;

wherein the time block delta RMS current is a value that is a difference between an RMS current of a last current cycle of the conductor in the time block and an RMS current of a first current cycle of the conductor in the time block;

wherein the time block power factor is an angle between the voltage cycles and the current cycles of the conductor during the time block; and wherein the time block source impedance is a quotient of the time block delta RMS voltage divided by the time block delta RMS current.

22. The method of claim 20, wherein each data block value set includes one or more of:
a data block maximum peak voltage;
a data block minimum peak voltage;
a data block average RMS voltage;
a data block RMS voltage standard deviation;
a data block maximum RMS voltage;
a data block delta RMS voltage;
a data block maximum peak current;
a data block minimum peak current;
a data block average RMS current;
a data block RMS current standard deviation;
a data block maximum RMS current;
a data block delta RMS current;
a data block power factor; and
a data block source impedance.

23. The method of claim 22,
wherein each voltage cycle comprises two voltage half cycles;
wherein each current cycle comprises two current half cycles;
wherein the data block maximum peak voltage is a maximum peak voltage of the conductor during the data block;
wherein the data block minimum peak voltage is a minimum peak voltage of the conductor during the data block;

wherein the data block average RMS voltage is an average of an RMS (Root Mean Squared) voltage of each of the voltage half cycles of the conductor over the data block;

wherein the data block RMS voltage standard deviation is a standard deviation of an RMS voltage of each of the voltage half cycles of the conductor during a first uncompressed electrical value set of the data block;

wherein the data block maximum RMS voltage is a maximum RMS voltage of any half voltage cycle of the conductor during the data block;

wherein the data block delta RMS voltage is a value that is a difference between an RMS voltage of a last voltage cycle of the conductor in the data block and an RMS voltage of first voltage cycle of the conductor in the data block;

wherein the data block maximum peak current is a maximum peak current of the conductor during the data block;

wherein the data block minimum peak current is a minimum peak current of the conductor during the data block;

wherein the data block average RMS current is an average of an RMS current of each of the current half cycles of the conductor during the data block;

wherein the data block maximum RMS current is a maximum RMS current of any current half cycle of the conductor during the data block;

wherein the data block RMS current standard deviation is a standard deviation of the RMS current of each of the current half cycles of the conductor during a first uncompressed electrical value set of the data block;

wherein the data block delta RMS current is a value that is a difference between an RMS current of a last current cycle of the conductor in the data block and an RMS current of a first current cycle of the conductor in the data block;

wherein the data block power factor is an angle between the voltage cycles and the current cycles of the conductor during the data block; and wherein the data block source impedance is a quotient of the data block delta RMS voltage divided by the data block delta RMS current.

24. The method of claim 22, wherein the set of compression criteria includes one or more of:
the time block RMS voltage standard deviation of the present time block not deviating from the data block RMS voltage standard deviation of the preceding data block by more than a percent variation form of the data block RMS voltage standard deviation of the preceding data block;

the time block average RMS voltage of the present time block not deviating from the data block average RMS voltage of the preceding data block by more than the percent variation form of the data block RMS voltage standard deviation of the preceding data block;

the time block delta RMS voltage of the present time block less than the percent variation form of the data block RMS voltage standard deviation of the preceding data block;

the time block maximum RMS voltage of the present time block not exceeding the average RMS voltage of the preceding data block by more than three standard deviations of the data block RMS voltage standard deviations of the preceding data block;

the time block RMS current standard deviation of the present time block not deviating from the data block RMS current standard deviation of the preceding data block by more than a percent variation form of the data block RMS current standard deviation of the preceding data block;

the time block average RMS current of the present time block not deviating from the data block average RMS current of the preceding data block by more than the percent variation form of the data block RMS current standard deviation of the preceding data block;

the time block delta RMS current of the present time block less than the percent variation form of the data block RMS current standard deviation of the preceding data block;

the time block maximum RMS current of the present time block not exceeding the data block average RMS current of the preceding data block by more than three standard deviations of the data block RMS current standard deviations of the preceding data block;

the time block maximum peak voltage of the present time block not exceeding a maximum peak voltage threshold set above the data block maximum peak voltage of the preceding data block;

the time block minimum peak voltage of the present time block not falling below a minimum peak voltage threshold set below the data block minimum peak voltage of the preceding data block;

the time block maximum peak current of the present time block not exceeding a maximum peak current threshold set above the data block maximum peak current of the preceding data block; and the time block minimum peak current of the present time block not falling below a minimum peak current threshold set below the data block minimum peak current of the preceding data block.

25. The method of claim 22, wherein the set of compression criteria includes all of:

the time block RMS voltage standard deviation of the present time block not deviating from the data block RMS voltage standard deviation of the preceding data block by more than a percent variation form of the data block RMS voltage standard deviation of the preceding data block;

the time block average RMS voltage of the present time block not deviating from the data block average RMS voltage of the preceding data block by more than the percent variation form of the data block RMS voltage standard deviation of the preceding data block;

the time block delta RMS voltage of the present time block less than the percent variation form of the data block RMS voltage standard deviation of the preceding data block;

the time block maximum RMS voltage of the present time block not exceeding the average RMS voltage of the preceding data block by more than three standard deviations of the data block RMS voltage standard deviations of the preceding data block;

the time block RMS current standard deviation of the present time block not deviating from the data block RMS current standard deviation of the preceding data block by more than a percent variation form of the data block RMS current standard deviation of the preceding data block;

the time block average RMS current of the present time block not deviating from the data block average RMS current of the preceding data block by more than the percent variation form of the data block RMS current standard deviation of the preceding data block;

the time block delta RMS current of the present time block less than the percent variation form of the data block RMS current standard deviation of the preceding data block;

the time block maximum RMS current of the present time block not exceeding the data block average RMS current of the preceding data block by more than three standard deviations of the data block RMS current standard deviations of the preceding data block;

the time block maximum peak voltage of the present time block not exceeding a maximum peak voltage threshold set above the data block maximum peak voltage of the preceding data block;

the time block minimum peak voltage of the present time block not falling below a minimum peak voltage threshold set below the data block minimum peak voltage of the preceding data block;

the time block maximum peak current of the present time block not exceeding a maximum peak current threshold set above the data block maximum peak current of the preceding data block; and the time block minimum peak current of the present time block not falling below a minimum peak current threshold set below the data block minimum peak current of the preceding data block.

26. The method of claim 16, further comprising:

generating, by a multi-channel recorder, for each of the plurality of power quality nodes, a load profile, the load profile based on the data block value sets generated by the power quality node during a series of load cycles, each load cycle covering a period of time from when a load is started to when the load is stopped, the load coupled to the conductor to which the power quality node is coupled;

generating, by the multi-channel recorder, for the each of the plurality of power quality nodes, one or more notification thresholds based the load profile of the load coupled to the power quality node; and generating, by at least one of the plurality of power quality nodes, notifications based on comparing the one or more notification thresholds with an electrical value set of the present time block.

27. The method of claim 26, wherein generating, by the multi-channel recorder a load profile comprises:

generating, by the multi-channel recorder, for each of the series of load cycles, a set of load cycle operational characteristics and a set of load cycle operational characteristic standard deviations;

generating, by the multi-channel recorder, a set of load profile operational characteristics based on averaging each of the load cycle operational characteristics over each of the series load cycles; and generating by the multi-channel recorder a set of load profile operational characteristic standard deviations based on a standard deviation of each of the load cycle operational characteristics over each of the series load cycles.

28. The method of claim 27, wherein the set of load cycle operational characteristics includes one or more of:

a load cycle average RMS current;
a load cycle average RMS current standard deviation;
a load cycle average power factor;
a load cycle average power factor standard deviation;
a load cycle average current THD (Total Harmonic Distortion);
a load cycle average current THD standard deviation;
a load cycle data block RMS current standard deviation;

a standard deviation of the load cycle data block RMS current standard deviation; and a load cycle stability index.

29. The method of claim 28, wherein generating, by the multi-channel recorder, the set of load cycle operational characteristics for each of the series of load cycles comprises:

generating, by the multi-channel recorder, the load cycle average RMS current by multiplying a data block average RMS current of each of the compressed data blocks in the load cycle times a data block time length of the compressed data block, resulting in a series of products, summing the products to a sum, then dividing the sum by a number of compressed data blocks in the load cycle.

30. The method of claim 28, wherein generating, by the multi-channel recorder, the set of load cycle operational characteristics for each of the series of load cycles comprises:

generating, by the multi-channel recorder, the load cycle average current THD based on one or more current blocks received from the power quality node, each current block comprising a plurality of samples of the current of the conductor of the power quality node.

31. The method of claim 28, wherein generating, by the multi-channel recorder, the set of load profile operational characteristics comprises:

generating, by the multi-channel recorder, the load cycle stability index by subtracting the load cycle average RMS current from a stability metric, wherein the stability metric is calculated by taking a number of time blocks represented by the compressed data blocks in the load cycle and dividing by a total number of time blocks in the load cycle.

32. The method of claim 28, wherein the set of load profile operational characteristics includes one or more of:

a load profile average RMS current;
a load profile average RMS current standard deviation;
a load profile average power factor;
a load profile average power factor standard deviation;
a load profile average current THD;
a load profile average current THD standard deviation;
a load profile data block RMS current standard deviation;
a standard deviation of the load profile data block RMS current standard deviation; and
a load profile stability index.

33. The method of claim 27, wherein generating, by the multi-channel recorder, for the each of the plurality of power quality nodes, one or more notification thresholds comprises:

setting, by the multi-channel recorder, each notification threshold to one of the load profile operational characteristics plus one or more multiples of a corresponding one of the load profile operational characteristic standard deviations.

34. The method of claim 16, generating a plurality of dynamic resistance values, generating each dynamic resistance value by one of the plurality of power quality nodes for one of the time blocks by dividing a delta V value by a delta I value, wherein the delta V value is an RMS voltage of the conductor at a minimum RMS current of the conductor during the time block minus an RMS voltage of the conductor at a maximum RMS current of the conductor during the time block, wherein the delta I value is the maximum RMS current of the conductor during the time block minus the minimum RMS current of the conductor during the time block;

generating, by a multi-channel recorder, a supply impedance value by subtracting the dynamic resistance value of a first of the power quality nodes, coupled to a supply conductor, from the dynamic resistance value of a second of the power quality nodes, coupled to a load conductor; and generating, by the multi-channel recorder, a report based on changes in the supply impedance value over many time blocks.

35. The method of claim 34, each of the plurality of power quality nodes synchronizing the electrical value sets generated by that power quality node with the electrical value sets generated by the other power quality nodes; and synchronizing, by the multi-channel recorder, the power quality nodes.

* * * * *